United States Patent
Fujisawa

(10) Patent No.: US 8,724,416 B2
(45) Date of Patent: May 13, 2014

(54) INFORMATION PROCESSING SYSTEM INCLUDING SEMICONDUCTOR DEVICE HAVING SELF-REFRESH MODE

(76) Inventor: Hiroki Fujisawa, Tokyo (JP)

( * ) Notice: Subject to any disclaimer, the term of this patent is extended or adjusted under 35 U.S.C. 154(b) by 95 days.

(21) Appl. No.: 13/559,466

(22) Filed: Jul. 26, 2012

(65) Prior Publication Data

US 2013/0028038 A1    Jan. 31, 2013

(30) Foreign Application Priority Data

Jul. 28, 2011    (JP) .................. 2011-165712

(51) Int. Cl.
 *G11C 7/00*    (2006.01)
 *G11C 11/406*    (2006.01)
(52) U.S. Cl.
 CPC .................. *G11C 11/406* (2013.01)
 USPC .............. 365/222; 365/233.11; 365/233.1; 365/233.12; 365/194; 365/189.05
(58) Field of Classification Search
 CPC ........... G11C 11/406; G11C 11/40615; G11C 11/40618; G11C 2211/4061; G11C 2211/4065
 USPC .............. 365/222, 189.05, 189.04, 233.11, 365/233.1, 233.12
 See application file for complete search history.

(56) References Cited

U.S. PATENT DOCUMENTS

| 6,373,303 B2 | 4/2002 | Akita |
| 2001/0043097 A1 | 11/2001 | Akita |
| 2007/0206431 A1* | 9/2007 | Matsuzaki ................ 365/222 |

FOREIGN PATENT DOCUMENTS

JP    2001-332086 A    11/2001

* cited by examiner

*Primary Examiner* — Thong Q Le
(74) *Attorney, Agent, or Firm* — McGinn IP Law Group, PLLC

(57) ABSTRACT

Disclosed herein is a semiconductor device having self-refresh modes in which a refresh operation of storage data is periodically performed asynchronously with an external clock signal. The semiconductor device performs the refresh operation on n memory cells in response to an auto-refresh command. The semiconductor device periodically performs the refresh operation on m memory cells included in the memory cell array during the self-refresh mode, where m is smaller than n.

15 Claims, 21 Drawing Sheets

| SYMBOL | CKE PRIOR CYCLE | CKE CURRENT CYCLE | CSB | FASB | CASB | WEB |
|---|---|---|---|---|---|---|
| REF | H | H | L | L | L | H |
| SRE | H | L | L | L | L | H |
| SRX | L | H | H | — | — | — |
| PDE | H | L | L | H | H | H |
| PDX | L | H | H | — | — | — |

FIG.4

|  DIMM401 | | DIMM402 | |
| --- | --- | --- | --- |
| RANK1 | RANK2 | RANK1 | RANK2 |
| 120 Ω | ODT off | ODT off | 30 Ω |

FIG.22A

| DIMM401 | | DIMM402 | |
| --- | --- | --- | --- |
| RANK1 | RANK2 | RANK1 | RANK2 |
| ODT off | 30 Ω | 120 Ω | ODT off |

FIG.22B

| DIMM401 | | DIMM402 | |
| --- | --- | --- | --- |
| RANK1 | RANK2 | RANK1 | RANK2 |
| ODT off | ODT off | ODT off | 30 Ω |

FIG.22C

| DIMM401 | | DIMM402 | |
| --- | --- | --- | --- |
| RANK1 | RANK2 | RANK1 | RANK2 |
| ODT off | 30 Ω | ODT off | ODT off |

FIG.22D

INFORMATION PROCESSING SYSTEM INCLUDING SEMICONDUCTOR DEVICE HAVING SELF-REFRESH MODE

BACKGROUND OF THE INVENTION

1. Field of the Invention

The present invention relates to an information processing system and a control method thereof, and more particularly to an information processing system including a semiconductor device with a self-refresh mode and a control method thereof. The present invention also relates to a control method of a controller, and more particularly to a controller that controls a semiconductor device with a self-refresh mode and a control method thereof.

2. Description of Related Art

An operation mode called a self-refresh mode is provided for the DRAM. The self-refresh mode is a kind of standby mode in which refresh of storage data included in storage cells is periodically performed inside of the DRAM in asynchronism with outside. A controller can stop issuance of many external signals such as an external clock signal and a command signal to be supplied to the semiconductor device, during a period when the semiconductor device has entered the self-refresh mode. During the period when the semiconductor device has entered the self-refresh mode, an input first-stage circuit such as a clock receiver included in the DRAM to receive a signal supplied from outside is inactivated and operations of circuit blocks such as the DLL circuit are also stopped. Accordingly, when the semiconductor device has entered the self-refresh mode, entire power consumption of the system becomes quite low. Furthermore, the refresh operation is periodically performed inside of the DRAM, so that the storage data are not lost.

However, once the semiconductor device has entered the self-refresh mode, it takes a relatively long time to enable input of a next command after the semiconductor device exits the self-refresh mode.

The first reason thereof is that a refresh operation is performed in asynchronism with an external clock signal during the self-refresh mode and thus the refresh operation may be performed at a time when a self-refresh exit command is issued. Therefore, even after the self-refresh exit command is issued, a row command (such as an active command or an auto-refresh command) cannot be issued during a refresh period required for one refresh operation.

The second reason is that the operation of the DLL circuit stops during the period when the semiconductor device has entered the self-refresh mode. Consequently, it takes a long time for the DLL circuit to be locked again (for example, to set a delay amount reset in the DLL circuit to match phases of the external clock signal and the internal clock signal with each other) after the semiconductor device exits the self-refresh mode. This means delay of a command issued by the controller after the exit. This means, for example, that a long time is required after the semiconductor device exits the self-refresh mode and before input of a command (a read command and the like) requiring a phase-controlled internal clock signal becomes possible.

To solve this problem, a method that enables to intermittently activates an DLL circuit also during a period when a semiconductor device has entered a self-refresh mode is proposed in Japanese Patent Application Laid-open No. 2001-332086. Although such an operation does not comply with DRAM standards, a time required after the semiconductor device exits from the self-refresh mode and before the DLL circuit is locked again can be greatly reduced by performing this operation.

However, in the DRAM described in Japanese Patent Application Laid-open No. 2001-332086, while a timing when a command requiring an internal clock signal phase-controlled is input after the semiconductor device exits the self-refresh mode can be made earlier, the other problem (the first reason) cannot be solved. That is, a timing when a row command is input after the semiconductor device exits the self-refresh mode cannot be made earlier. Accordingly, it is necessary to wait for a relatively long time to input the active command or the like after the semiconductor device exits the self-refresh mode.

This problem occurs not only in the DRAM but also in all semiconductor devices with the self-refresh mode. For example, there is the same problem also in a semiconductor device that in a part includes nonvolatile memory cells having a problem of cell data retention.

SUMMARY

In one embodiment, there is provided a semiconductor device that includes: a memory cell array that has a plurality of memory cells requiring an refresh operation in order to retain of storage data therein; and an access control circuit. The semiconductor device enters a self-refresh mode in response to a self-refresh command, and exits the self-refresh mode in response to a self-refresh exit command. The access control circuit performs the refresh operation on n memory cells included in the memory cell array in response to an auto-refresh command, and the access control circuit periodically performs the refresh operation on m memory cells included in the memory cell array asynchronously with an external clock signal during the self-refresh mode, where m is smaller than n.

In another embodiment, there is provided a controller that includes a command issuing unit that issues at least a self-refresh command that causes a semiconductor device to enter a self-refresh mode in which a refresh operation of storage data in memory cell array is periodically performed asynchronously with the clock signal, a self-refresh exit command that causes the semiconductor device to exit the self-refresh mode, and a first command that causes the semiconductor device to perform an access operation to the memory cell array. The command issuing unit, in a first operation mode, issues the first command after elapse of a first period at earliest from issuing the self-refresh exit command, and the command issuing unit, in a second operation mode, issues the first command after elapse of a second period that is shorter than the first period at earliest from issuing the self-refresh exit command.

In still another embodiment, there is provided a control method of a controller, the method including: setting a semiconductor device to a first or a second operation mode, the semiconductor device having a self-refresh mode in which a refresh operation of storage data is periodically performed; issuing a self-refresh command that causes the semiconductor device to enter the self-refresh mode; issuing a self-refresh exit command that causes the semiconductor device to exit the self-refresh command; issuing a first command that causes the semiconductor device to perform an access operation to the storage data while the semiconductor device is not in the self-refresh mode; issuing the first command after elapse of a first period at earliest from issuing the self-refresh exit command while the semiconductor device is in the first operation mode; and issuing the first command after elapse of a second period that is shorter than the first period at earliest from issuing the self-refresh exit command while the semiconductor device is in the second operation mode.

In still another embodiment, there is provided an information processing system that includes: a first device including a memory cell array that holds storage data, the first device having a self-refresh mode in which a refresh operation of the storage data is periodically performed asynchronously with an external clock signal having a predetermined frequency; and a second device issuing the external clock signal, a self-refresh command that causes the first device to enter the self-refresh mode, a self-refresh exit command that causes the first device to exit the self-refresh mode, and an auto-refresh command. The first device performs the refresh operation on n memory cells included in the memory cell array in response to the auto-refresh command, and the first device periodically performs the refresh operation on m memory cells included in the memory cell array during the self-refresh mode, where m is smaller than n.

In still another embodiment, there is provided a control method of an information processing system having a controller and a semiconductor device. The controller issues an auto-refresh command, a self-refresh command, and a self-refresh exit command to the semiconductor device. The semiconductor device performs a refresh operation on n memory cells included in a memory cell array in response to the auto-refresh command, the semiconductor device enters an self-refresh mode in response to the self-refresh command, and exits the self-refresh mode in response to the self-refresh exit command, and the semiconductor device periodically performs the refresh operation on m memory cells included in the memory cell array for each first cycle during the self-refresh mode asynchronously with an external clock signal having a predetermined frequency, where m is smaller than n.

According to the semiconductor device, the information processing system, and the control method thereof of the present invention, the number of memory cells to be refreshed in each cycle during the self-refresh mode is smaller than that of memory cells to be refreshed in response to an auto-refresh command. Therefore, a time required for one refresh operation is reduced in the self-refresh mode. Accordingly, a row command can be issued a shorter time after issuance of a self-refresh exit command.

According to the controller and the control method thereof of the present invention, the semiconductor device can be set to the first or second operation mode. Therefore, the semiconductor device can operate in a new mode in which a row command can be issued a shorter time after issuance of a self-refresh exit command from the time the semiconductor device has exited the self-refresh mode while an operation compliant with the standards is enabled.

BRIEF DESCRIPTION OF THE DRAWINGS

FIG. 4 is a list of commands indicated by command signals CMD and a clock enable signal CKE;

FIGS. 22A to 22D are tables for explaining impedance controls for respective ranks, in which FIG. 22A shows a case where a write operation is performed for the DIMM 401, FIG. 22B shows a case where a write operation is performed for the DIMM 402, FIG. 22C shows a case where a read operation is performed for the DIMM 401, and FIG. 22D shows a case where a read operation is performed for the DIMM 402.

DETAILED DESCRIPTION OF THE EMBODIMENTS

A representative embodiment of the present invention is that the number of memory cells to be refreshed in each cycle during a period when the semiconductor device has entered the self-refresh mode is smaller than that of memory cells to be refreshed in response to an auto-refresh command. Accordingly, a refresh period required after a refresh operation is started and before the refresh operation is ended during the self-refresh mode is reduced and thus a period when issuance of a row command for accessing memory cells is inhibited after a self-refresh exit command is issued is reduced.

Figure 1:
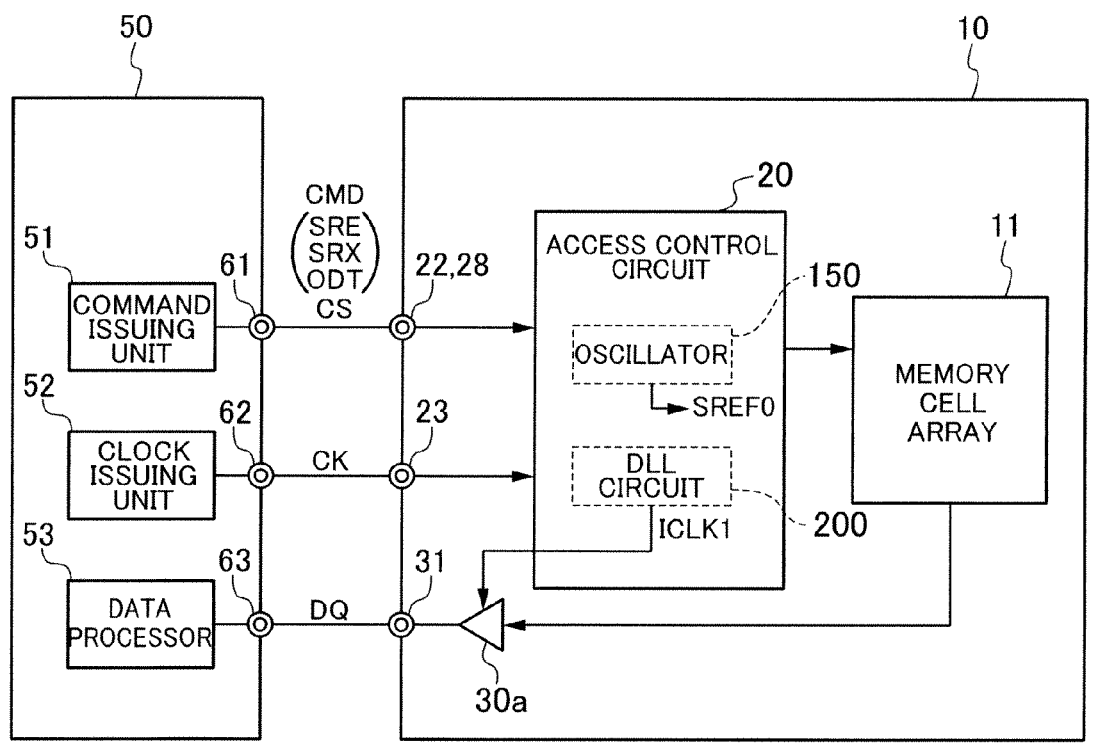
FIG. 1 is a schematic diagram for explaining an embodiment of the present invention.

Referring now to FIG. 1, it shows an information processing system including a controller 50 and a semiconductor device 10. The semiconductor device 10 includes a command terminal 22, a clock terminal 23, and a data terminal 31, which are connected to a command terminal 61, a clock terminal 62, and a data terminal 63 included in the controller 50, respectively. The command terminal 22 includes a chip select terminal 28 which will be explained later. The controller 50 includes a command issuing unit 51 that issues a command CMD, a clock issuing unit 52 that issues an external clock signal CK, and a data processor 53 that processes storage data DQ. The command terminal 22 includes a plurality of control pins (not shown), and plural commands (first and second commands, for example), which will be explained later, are defined by corresponding logical combinations of plural control signals. In the present invention, an external clock signal having a predetermined frequency is also referred to as "synchronization signal" or "external synchronization signal". The controller 50 does not need to be configured with one chip and, for example, the clock issuing unit 52 and the other units can be configured with separate chips.

The semiconductor device 10 includes a memory cell array 11 that holds storage data, an output buffer circuit 30a that outputs the storage data read from the memory cell array 11 in synchronism with an internal clock signal ICLK1, and an access control circuit 20 that performs an access to the memory cell array 11. The access control circuit 20 includes a DLL circuit 200 and an oscillator 150. The DLL circuit 200 generates the internal clock signal ICLK1 phase-controlled, based on the external clock signal CK.

The oscillator 150 periodically generates a refresh signal SREF0 during a self-refresh mode. Timings when the refresh signal SREF0 is generated are in asynchronism with the external clock signal CK and therefore a refresh operation is performed in asynchronism with the external clock signal CK when the semiconductor device has entered the self-refresh mode.

The command CMD issued by the controller 50 includes a self-refresh command SRE for entering the self-refresh mode, a self-refresh exit command SRX for exiting the self-refresh mode and the like, in addition to a row command and a column command.

Figure 2:
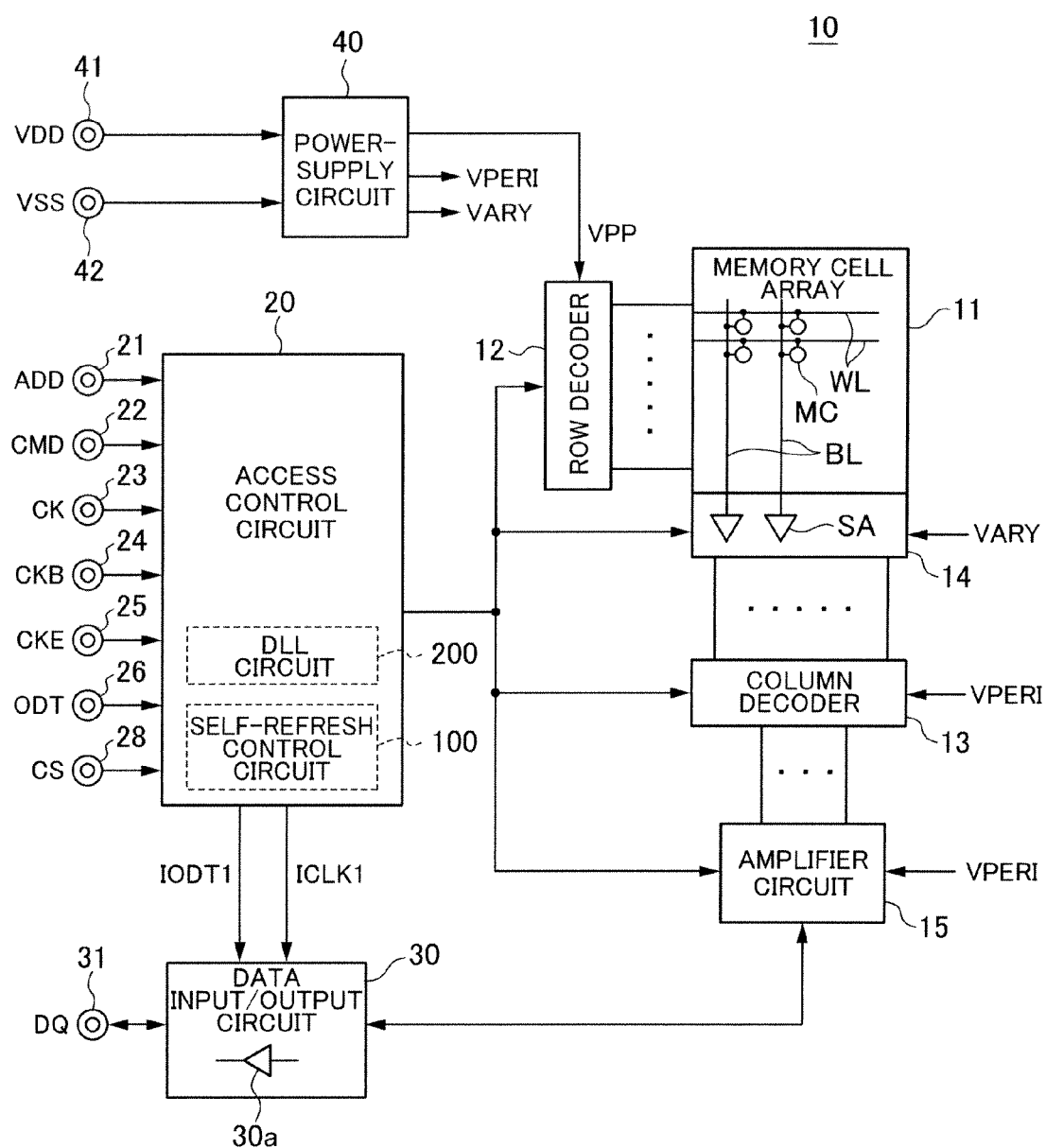
FIG. 2 is a block diagram indicative of an embodiment of a general configuration of a semiconductor device 10 according to a first embodiment of the present invention.

The row command causes the access control circuit 20 to perform an access to the memory cell array 11 based on a row address and corresponds to an active command ACT, an auto-refresh command REF and the like. In the present invention, these commands are also referred to as "first commands". On the other hand, the column command causes the access control circuit 20 to control a state of the data terminal 31 based on a column address and corresponds to a read command RD, a write command WT and the like. As shown in FIG. 2 explained later, when the read command RD is issued, data in an amplifier circuit 15 is output to outside through the data terminal 31. When the write command WT is issued, data supplied from outside is supplied to the amplifier circuit 15 through the data terminal 31. Although not relevant to the column address, an impedance control signal ODT used by the access control circuit 20 to control an impedance of the data terminal 31 also belongs to the column command. Among these commands, the read command RD and the impedance control signal ODT are commands for controlling a state of the data terminal 31 in synchronism with the internal clock signal ICLK1 and these commands are also referred to as "second commands" in the present invention.

The information processing system shown in FIG. 1 has first and second operation modes. The first operation mode is compliant with DRAM standards (JEDEC (Joint Electron Device Engineering Council) Solid State Technology Association), and the second operation is different from the DRAM standards. In either case where the information processing system is set to the first or second operation mode, the semiconductor device 10 enters the self-refresh mode when the self-refresh command SRE is issued from the controller 50 to the semiconductor device 10 and exits the self-refresh mode when the self-refresh exit command SRX is issued. However, an operation performed by the semiconductor device 10 during the self-refresh mode differs between the first and second operation modes. On the other hand, in either case where the first or second operation mode is set, the access control circuit 20 refreshes n memory cells included in the memory cell array 11 when the controller 50 issues the auto-refresh command REF to the semiconductor device 10.

In a case where the first operation mode is set, when the semiconductor device 10 enters the self-refresh mode, the access control circuit 20 periodically performs the refresh operation in asynchronism with outside by using the oscillator 150. Therefore, a performing timing of the refresh operation is in asynchronism with the external clock signal CK. Accordingly, when issuance of the self-refresh exit command SRX and an asynchronous refresh operation overlap, the latter has a priority. The number of memory cells to be refreshed in one refresh operation is n, which is equal to that of memory cells to be refreshed when the auto-refresh command REF is issued. This means that n memory cells are periodically refreshed when the semiconductor device 10 has entered the self-refresh mode in the case where the first operation mode is set.

When the semiconductor device 10 enters the self-refresh mode, the DLL circuit 200 is inactivated and power consumption is reduced. When the DLL circuit 200 is inactivated, update information that is held until then is discarded. This is because it is preferable that the DLL circuit 200 performs a cold start in conjunction with issuance of the self-refresh exit command SRX without referring to previous update information when the controller changes a frequency of the external clock signal CK during the self-refresh mode. The DLL circuit 200 is brought into a locked state by plural times of updating. The update information and lock will be explained later. During a period when the semiconductor device 10 has entered the self-refresh mode, the clock issuing unit 52 included in the controller 50 in principle stops issuance of the external clock signal CK. Stop means that the external clock signal CK keeps a high or low state without oscillating, or has a high impedance. When the self-refresh exit command SRX is issued, the DLL circuit 200 is temporarily activated and phase states of the external clock signal CK and the internal clock signal ICLK1 in the semiconductor device are updated. At that time, the DLL circuit 200 is not reset and the update information is maintained. Therefore, only a previous state is updated (a subsequent update value is determined based on a previous update value). Accordingly, a time required for the DLL circuit 200 to be locked (for the phases of the external clock signal CK and the internal clock signal ICLK1 in the semiconductor device to be almost matched with each other) after the DLL circuit 200 is activated in response to issuance of the self-refresh exit command SRX is quite short. During a period when the DLL circuit 200 is activated, the external clock signal CK is issued from the clock issuing unit 52 included in the controller 50. That is, the external clock signal CK is issued from the clock issuing unit 52 only corresponding to a period when the DLL circuit 200 is activated.

As compared to the first operation mode, in a case where the second operation mode is set, when the semiconductor device 10 enters the self-refresh mode, the access control circuit 200 periodically performs the refresh operation with a higher frequency by using the oscillator 150. Accordingly, the number of memory cells to be refreshed in one refresh operation is smaller than that of memory cells to be refreshed when the auto-refresh command REF is issued and is m (<n) This means that m memory cells are periodically refreshed when the semiconductor device 10 has entered the self-refresh mode in the case where the second operation mode is set. Therefore, in the case where the second operation mode is set, a refresh period required after a refresh operation is started and before the refresh operation is ended during the self-refresh mode is reduced. As a result, a period when issuance of a row command is inhibited after issuance of the self-refresh exit command SRX is reduced.

Preferred embodiments of the present invention will be explained below in detail with reference to the accompanying drawings.

Turning to FIG. 2, the semiconductor device 10 according to the present embodiment is a DRAM and includes the memory cell array 11. The semiconductor device 10 is mainly constituted by an N-channel transistor and a P-channel transistor. In the memory cell array 11, a plurality of word lines WL and a plurality of bit lines BL intersecting with each other are provided and a plurality of memory cells MC are arranged at intersections thereof, respectively. Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA. As explained later, the memory cell array 11 is divided into eight banks.

Operations of the row decoder 12, the column decoder 13, the sense circuit 14, and the amplifier circuit 15 are controlled by the access control circuit 20. An address signal ADD, the command signal CMD, external clock signals CK and CKB, a clock enable signal CKE, the impedance control signal CDT, and a chip select signal CS are supplied to the access control circuit 20. These signals are input from outside through corresponding terminals 21 to 26 and 28. The external clock signals CK and CKB are synchronization signals complementary to each other. The chip select signal CS is used by the controller 50 to select the semiconductor device (the access control circuit 20). The access control circuit 20 controls the row decoder 12, the column decoder 13, the sense circuit 14, the amplifier circuit 15, and a data input/output circuit 30 based on these signals.

Specifically, when the command signal CMD indicates the active command ACT, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing. This operation is also referred to as "access to storage data" and a command for performing this operation is also referred to as "first command".

When the command signal CMD indicates the read command RD or the write command WT, the address signal ADD is supplied to the column decoder 13. In response thereto, the column decoder 13 connects a bit line BL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MC through the amplifier circuit and the sense amplifier SA. This operation is also referred to as "output of storage data" and a command for performing this operation is also referred to as "second command".

When the command signal CMD indicates the auto-refresh command REF, the access control circuit 20 supplies a count value (refresh address) of a refresh counter (not shown) to the row decoder 12. In response thereto, the row decoder 12 selects a word line WL indicated by the refresh address and accordingly memory cells MC connected to the selected word line WL are refreshed by the sense amplifiers SA. This operation is also referred to as "access to storage data" and a command for performing this operation is also referred to as "first command".

Furthermore, when the command signal CMD indicates the self-refresh command SRE, a self-refresh control circuit 100 included in the access control circuit 20 starts to cause the semiconductor device 10 to enter the self-refresh mode. When the command signal CMD indicates the self-refresh exit command SRX, the semiconductor device 10 exits the self-refresh mode. While the auto refresh and the self refresh of the present application are the same in that both refresh the storage data, they are different in power consumption or specifications of interface during the refresh. The consumption current in the self refresh is lower than that in the auto refresh. This is because the controller stops issuance of the external clock signal as a synchronization signal (which is a system clock for a memory buss and also referred to as "external synchronization signal"). In the semiconductor device, more clock buffers (input buffer circuits) that communicate with outside can be inactivated at the time of self refresh, so that power of internal circuits not related to the refresh in the semiconductor device can be controlled to be smallest. From the viewpoint of interface, impedance controls of the data terminal that outputs data are different, for example. In principle, the impedance control cannot be performed at the time of self refresh while it is possible at the time of auto refresh.

As shown in FIG. 2, the access control circuit 20 includes the DLL circuit 200. The DLL circuit 200 receives the external clock signals CK and CKB and generates the internal clock signal ICLK1 phase-controlled, based on the received signal. The DLL circuit 200 includes a delay circuit (corresponding to reference numeral 210 in FIG. 7) that delays the external clock signals CK and CKB, a delay adjusting circuit (corresponding to 220 and 250 in FIG. 7) that adjusts a delay amount of the delay circuit, and a phase comparing circuit (corresponding to 240 in FIG. 7) that compares phases of the internal clock signal ICLK1 output from the delay circuit and the external clock signals CK and CKB, and supplies a result of the comparison to the delay circuit. The internal clock signal ICLK1 is supplied to the output buffer circuit 30a included in the data input/output circuit 30 and accordingly read data DQ that are read from the memory cell array 11 are output from the data terminal 31 in synchronism with the internal clock signal ICLK1. An impedance control signal IODT1 is also supplied to the data input/output circuit 30. When the impedance control signal IODT1 is activated, the output buffer circuit 30a is brought into a predetermined state and accordingly the data terminal 31 is controlled to have a predetermined impedance. This operation is also referred to as "control of an impedance of the data terminal" and a command for performing this operation is also referred to as "second command".

These circuit blocks use predetermined internal voltages as operating power. These internal voltages are generated by a power-supply circuit 40 shown in FIG. 2. The power-supply circuit 40 receives an external potential VDD and a ground potential VSS supplied through power-supply terminals 41 and 42, respectively, and generates internal voltages VPP, VPERI, VARY and the like based on these potentials. The internal voltage VPP is generated by increasing the external potential VDD and the internal voltages VPERI and VARY are generated by decreasing the external potential VDD. The power-supply circuit 40 also generates a negative voltage (not shown).

The internal voltage VPP is mainly used by the row decoder 12. The row decoder 12 drives a word line WL selected based on the address signal ADD to a VPP level, thereby bringing cell transistors included in the memory cells MC into conduction. The internal voltage VARY is mainly used by the sense circuit 14. When activated, the sense circuit 14 drives one of paired bit lines to a VARY level and the other bit line to a VSS level, thereby amplifying read data that have been read. The internal voltage VPERI is used as an operating voltage for most of peripheral circuits such as the access control circuit 20. Power consumption of the semiconductor device 10 is reduced by using the internal voltage VPERI lower than the external voltage VDD as the operating voltage for these peripheral circuits.

Figure 3:
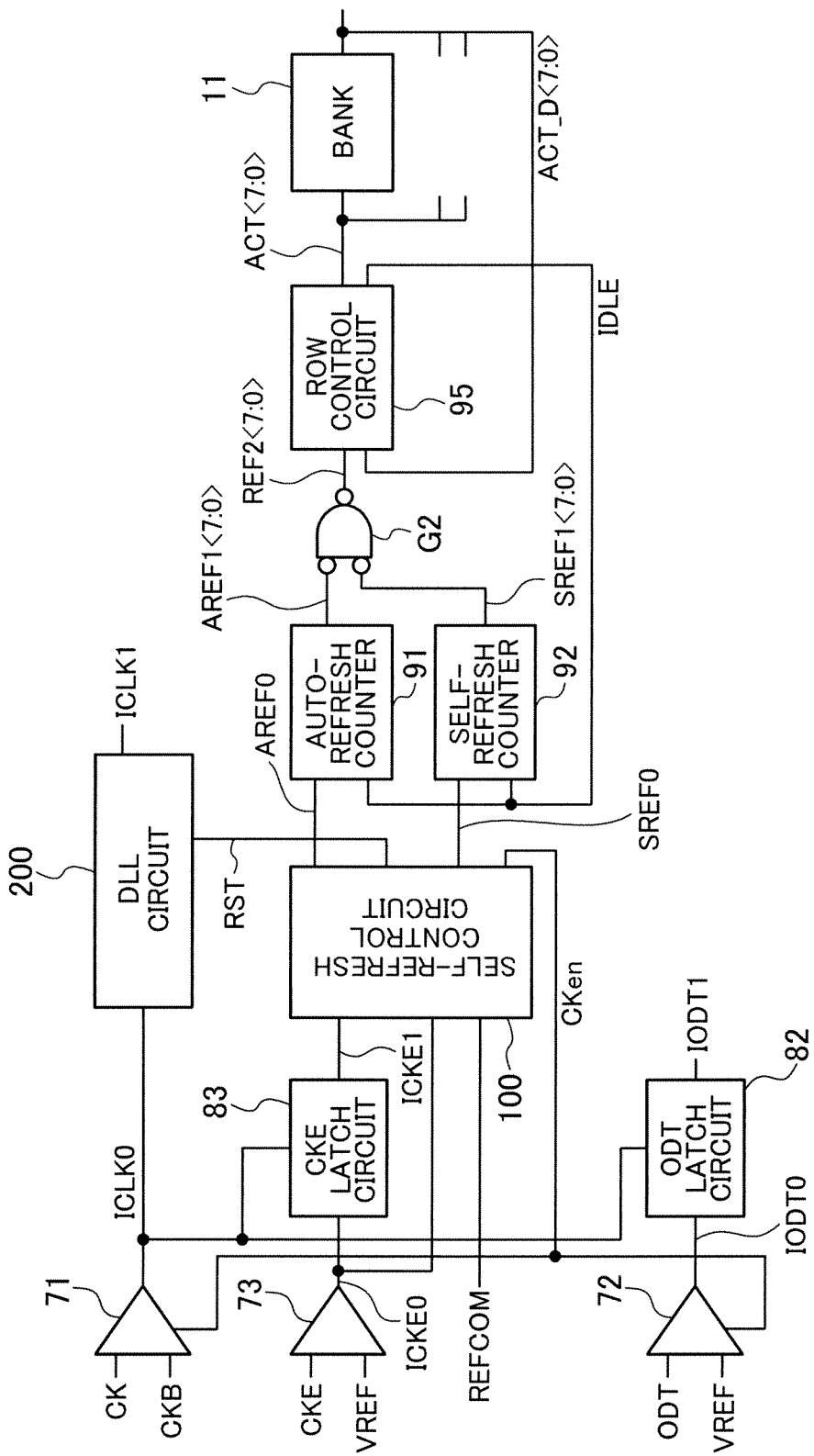
FIG. 3 is a block diagram indicative of an embodiment of main circuit blocks included in an access control circuit 20 according to the first embodiment of the present invention.

Turning to FIG. 3, the access control circuit 20 includes input buffer circuits 71 to 73. The input buffer circuit 71 receives the external clock signals CK and CKB and generates the internal clock signal ICLK0, and is also referred to as "first input buffer circuit" in the present invention. The input buffer circuit 72 receives the impedance control signal ODT and generates an impedance control signal IODT0, and is also referred to as "second input buffer circuit" in the present invention. The input buffer circuit 73 receives the clock enable signal CKE and generates a clock enable signal ICKE0, and is also referred to as "third input buffer circuit" in the present invention. Both of the input buffer circuits 71 and 72 are activated or inactivated according to an enable signal CKen. The input buffer circuits 71 and 72 are activated when the enable signal CKen is high. On the other hand, the input buffer circuit 73 is always activated. This is because the self-refresh exit command SRX is indicated by the clock enable signal CKE and thus the input buffer circuit 73 needs to be activated also in the self-refresh mode. The self-refresh command SRE is indicated by the command CMD input through the command terminal 22 and the clock enable signal CKE input through the clock enable terminal 25.

Turning to FIG. 4, each command is represented by a combination of the command signals CMD and a logic level of the clock enable signal CKE. In FIG. 4, "H" denotes a high level, "L" denotes a low level, and "-" denotes "Don't care". Furthermore, "CSB", "RASB", "CASB", and "WEB" denote a chip select signal, a row-address strobe signal, a column-address strobe signal, and a write enable signal, respectively. These signals CSB, RASB, CASB, and WEB are signals constituting the command signals CMD.

Specifically, when the signals CSB, RASB, and CASB are set to a low level (L) and the signal WEB is set to a high level (H) with the clock enable signal CKE kept at a high level (H), this is handled as the auto-refresh command REF. When the clock enable signal CKE is changed from the high level (H) to a low level (L) with the signals CSB, RASB, and CASB set at the low level (L) and the signal WEB set at the high level (H), this is handled as the self-refresh command SRE. When the clock enable signal CKE is changed from the high level (H) to the low level (L) with the signal CSB set at the low level (L) and the signals RASB, CASB, and WEB set at the high level (H), this is handled as a power-down command PDE. When the clock enable signal CKE is changed from the low level (L) to the high level (H) with the signal CSB set at the high level (H), this is handled as the self-refresh exit command SRX or a power-down exit command PDX.

The internal clock signal ICLK0 output from the input buffer circuit 71 is supplied to the DLL circuit 200. The DLL circuit 200 generates the internal clock signal ICLK1 phase-controlled, based on the internal clock signal ICLK0. Operation states of the DLL circuit 200 include a first active state, a second active state, and an inactive state, details of which will be explained later.

The first active state is an operation state where the delay circuit, the delay adjusting circuit, and the phase comparing circuit are active and thus the internal clock signal ICLK1 phase-controlled is continuously generated, and the DLL circuit 200 is brought into this operation state when a read command and the impedance control signal CDT are issued. Therefore, the internal clock signal ICLK1 generated in the first active state is supplied to the output buffer circuit 30a shown in FIG. 2. The second active state is an operation state where the internal clock signal ICLK1 phase-controlled is generated at a predetermined time interval, and the delay circuit, the delay adjusting circuit, and the phase comparing circuit are activated at the predetermined time interval. This is an update operation of confirming phases of the internal clock signal ICLK1 and the external clock signals CK and CKB at the predetermined time interval to eliminate phase shifting due to temperature or voltage changes. Specifically, this is an operation of updating information of the delay amount provided by the delay adjusting circuit to the delay circuit at the predetermined time interval. Therefore, the internal clock signal ICLK1 generated in the second active state does not need to be supplied to the output buffer circuit 30a shown in FIG. 2. The inactive state is a state where the delay circuit, the delay adjusting circuit, and the phase comparing circuit are inactive and accordingly the internal clock signal ICLK1 is not generated. However, information of the counter circuit 220 that holds update information included in the delay adjusting circuit is held.

The impedance control signal IOCDT0 supplied from the input buffer circuit 72 is latched by an ODT latch circuit 82. The ODT latch circuit 82 latches the impedance control signal IODT0 in synchronism with the internal clock signal ICLK0, and the impedance control signal IODT1 output from the ODT latch circuit 82 is supplied to the data input/output circuit 30 shown in FIG. 2.

The clock enable signal ICKE0 output from the input buffer circuit 73 is latched by a CKE latch circuit 83. The CKE latch circuit 83 latches the clock enable signal ICKE0 in synchronism with the internal clock signal ICLK0, and a clock enable signal ICKE1 output from the CKE latch circuit 83 is supplied to the self-refresh control circuit 100.

The self-refresh control circuit 100 is a circuit block that receives the clock enable signals ICKE0 and ICKE1, and a refresh command REFCOM and generates various internal signals. The refresh command REFCOM is common to the auto-refresh command REF and the self-refresh command SRE included in the command signal CMD. The refresh command REFCOM is a signal that becomes activated when the auto-refresh command REF and the self-refresh command SRE are input. The internal signals generated by the self-refresh control circuit 100 include an auto-refresh signal AREF0, the self-refresh signal SREF0, the enable signal CKen and a reset signal RST. A specific circuit configuration of the self-refresh control circuit 100 is explained later.

Turning to FIG. 3, the auto-refresh signal AREF0 is supplied to the auto-refresh counter 91 and the self-refresh signal SREF0 is supplied to the self-refresh counter 92. Auto-refresh signals AREF1<7:0> are output from the auto-refresh counter 91 and self-refresh signals SREF1<7:0> are output from the self-refresh counter 92. These auto-refresh signal AREF1 and self-refresh signal SREF1 are input to the OR gate circuit G2, and a refresh signal REF2 output from the OR gate circuit G2 is supplied to the row control circuit 95. The auto-refresh counter 91 is a circuit that generates the eight auto-refresh signals AREF1<7:0> with a small shift from each other eight consecutive times in a time sequence, respectively, in response to a plurality of toggles of the auto-refresh signal AREF0 and the idle signal IDLE. The self-refresh counter 92 is a circuit that generates the eight self-refresh signals SREF1<7:0> with a small shift with each other two consecutive times in a time sequence, respectively, in response to a plurality of toggles of the self-refresh signal SREF0 and the idle signal IDLE.

Figure 5A:
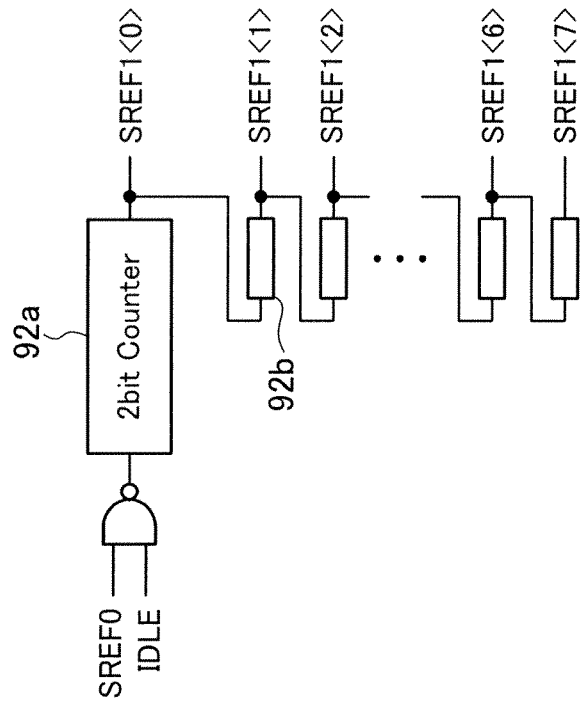
FIG. 5A is a circuit diagram indicative of an embodiment of an auto-refresh counter 91.

Turning to FIG. 5A, the auto-refresh counter 91 includes an 8-bit counter 91a that performs an 8-count operation when the auto-refresh signal AREF0 and the idle signal IDLE are both activated to a high level. The idle signal IDLE has a high level when the row control circuit 95 is in an idle state. Therefore, when the auto-refresh signal AREF0 is activated in a case where the row control circuit 95 is in an idle state, the 8-bit counter 91a generates an auto-refresh signal AREF1<0> eight times. Specifically, the idle signal IDLE is toggled seven times during a period when the auto-refresh signal AREF0 has a high level and the 8-bit counter 91a is counted up, thereby generating the auto-refresh signal AREF1<0> eight times. The auto-refresh signal AREF1<0> passes through a plurality of delay circuits 91b cascade-connected and is output as the auto-refresh signals AREF1<1> to AREF1<7>. Accordingly, the auto-refresh signals AREF1<0> to AREF1<7> are activated in a staggered operation with timings thereof slightly shifted with each other. This is to shift timings of refresh operations in the respective banks with each other to suppress a peak current.

With this configuration, when the auto-refresh signal AREF0 is activated and the idle signal IDLE is toggled seven times in the case where the row control circuit 95 is in an idle state, each of the auto-refresh signals AREF1<0> to AREF1<7> is activated eight times. These signals are supplied to the row control circuit 95 through the OR gate circuit G2. When the refresh signal REF2 is activated, a refresh operation is performed for a refresh address indicated by an address counter included in the row control circuit 95 and also a value of the address counter is incremented (or decremented). This causes eight word lines to be selected one after another in each bank, so that memory cells MC connected to the selected word lines are refreshed. That is, 64 word lines are selected in response to one auto-refresh signal AREF0.

Figure 5B:
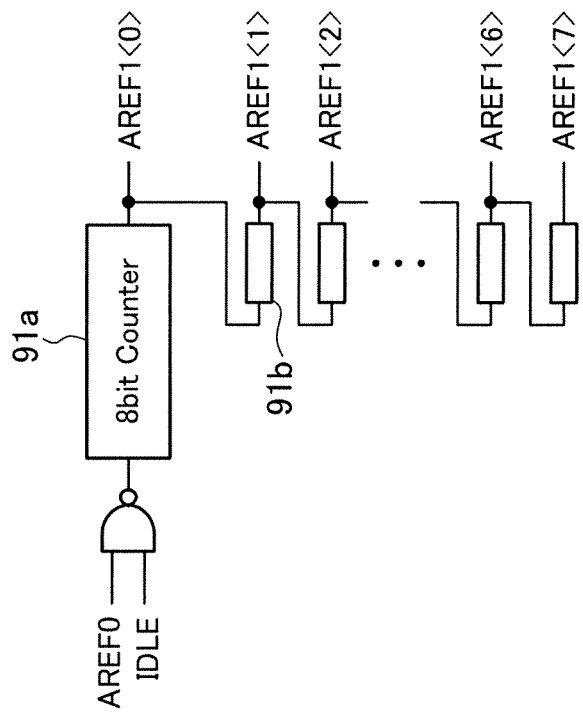
FIG. 5B is a circuit diagram indicative of an embodiment of a self-refresh counter 92.

On the other hand, the self-refresh counter 92 includes a 2-bit counter 92a that performs a 2-count operation when the self-refresh signal SREF0 and the idle signal IDLE are both activated to a high level, as shown in FIG. 5B. Therefore, when the self-refresh signal SREF0 is activated in a case where the row control circuit 95 is in an idle state, the 2-bit counter 92a generates the self-refresh signal SREF1<0> twice. Specifically, the idle signal IDLE is toggled once during a period when the self-refresh signal SREF0 has a high level and the 2-bit counter 92a is counted-up, thereby generating the self-refresh signal SREF1<0> twice. The self-refresh signal SREF1<0> passes through a plurality of delay circuits 92b cascade-connected and is output as the self-refresh signals SREF1<1> to SREF1<7>.

With this configuration, when the self-refresh signal SREF0 is activated in the case where the row control circuit 95 is in an idle state, each of the self-refresh signals SREF1<0> to SREF1<7> is activated twice. This causes two word lines to be selected one after the other in each bank, so that memory cells MC connected to the selected word lines are refreshed. That is, 16 word lines are selected in response to one self-refresh signal SREF0.

Figure 6:
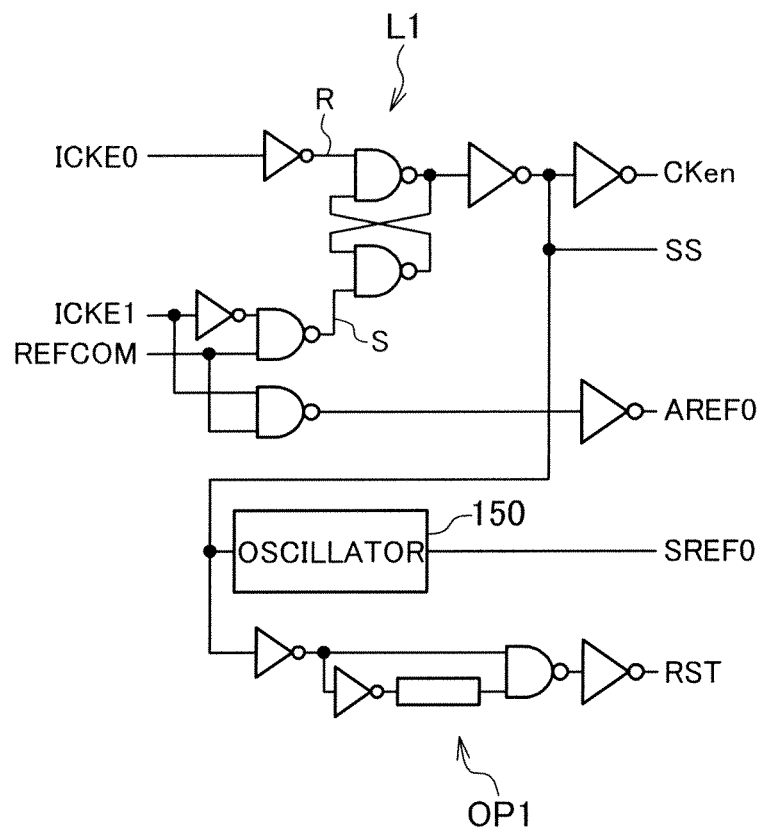
FIG. 6 is a main circuit diagram indicative of an embodiment of a self-refresh control circuit 100 shown in FIG. 3.

Turning to FIG. 6, the self-refresh control circuit 100 includes an SR latch circuit L1 and the oscillator 150. The SR latch circuit L1 includes a set node S and a reset node R and is set or reset when a low-level signal is input to the corresponding node.

To explain specifically, a signal indicating a negative AND of an inverse signal of the clock enable signal ICKE1 and the refresh command REFCOM is input to the set node S of the SR latch circuit L1. On the other hand, an inverse signal of the clock enable signal ICKE0 is input to the reset node R of the SR latch circuit L1. This causes the SR latch circuit L1 to be set when the clock enable signal ICKE1 has a low level and the refresh command REFCOM has a high level and to be reset when the clock enable signal ICKE0 has a high level. The clock enable signal ICKE1 has the low level and the refresh command REFCOM has the high level when the self-refresh command SRE is issued, and the clock enable signal ICKE0 has the high level when the self-refresh exit command SRX is issued. This means that the SR latch circuit L1 is set when the self-refresh command SRE is issued and reset when the self-refresh exit command SRX is issued.

A self-state signal SS output from the SR latch circuit L1 is inverted and used as an enable signal CKen. Therefore, the enable signal CKen has a low level when the SR latch circuit L1 is set, and is activated to a high level when the SR latch circuit L1 is reset. While it is unnecessary to output the self-state signal SS to outside of the self-refresh control circuit 100 in the present embodiment, the self-state signal SS is used outside of the self-refresh control circuit 100 in a third embodiment of the present invention, which will be explained later.

The self-state signal SS is supplied also to the oscillator 150. The oscillator 150 starts when the SR latch circuit L1 is set and periodically generates the self-refresh signal SREF0. Generation timings of the self-refresh signal SREF0 are asynchronous with the external clock signal CK. The self-refresh signal SREF0 is supplied to the self-refresh counter 92 shown in FIG. 3. The clock enable signal ICKE1 has a high level and the refresh command REFCOM has a high level when the auto-refresh command REF is issued, and a signal indicating an AND of the clock enable signal ICKE1 and the refresh command REFCOM is used as the auto-refresh signal AREF0. The auto-refresh signal AREF0 is supplied to the auto-refresh counter 91 shown in FIG. 3.

The self-state signal SS is supplied also to the one-shot pulse generating circuit OP1. The one-shot pulse generating circuit OP1 activates a reset signal RST in response to change of the self-state signal SS from a high level to a low level. This means that the reset signal RST is activated after the DLL circuit 200 is reset each time the self-refresh exit command SRX is issued.

Figure 7:
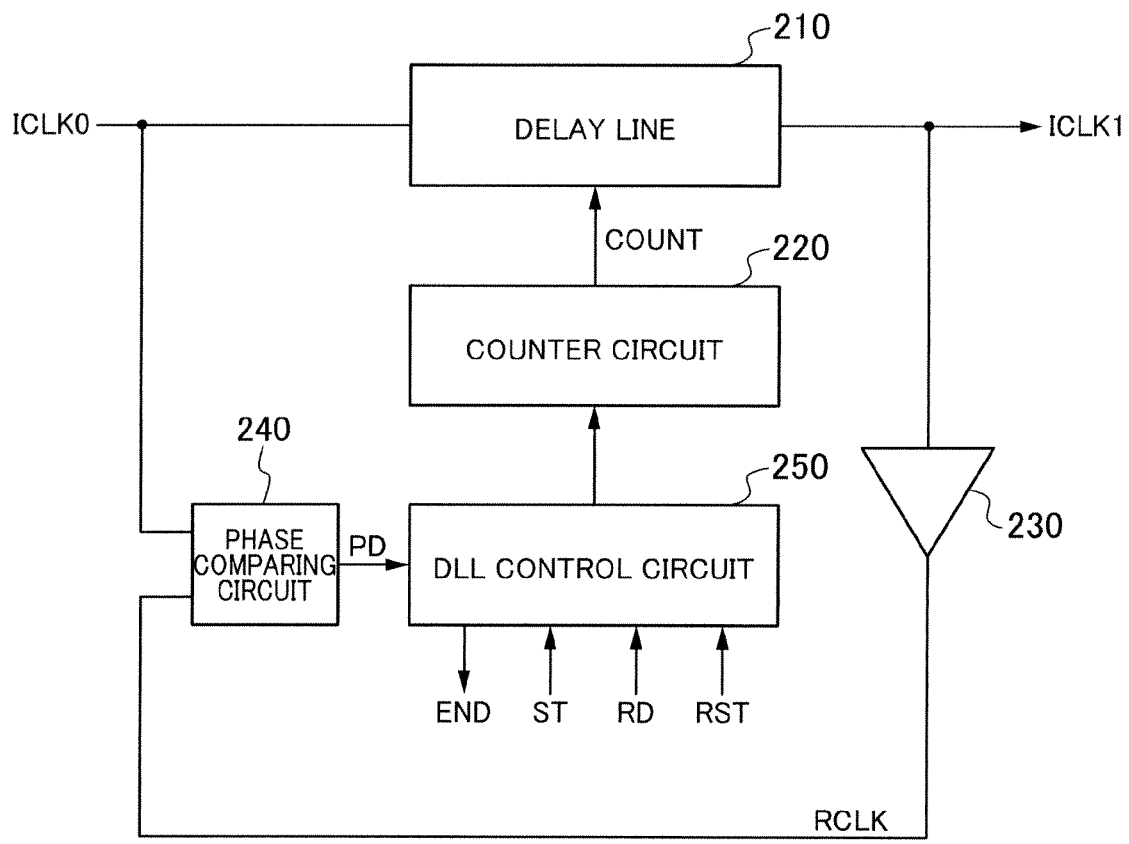
FIG. 7 is a block diagram indicative of an embodiment of a configuration of a DLL circuit 200.

Turning to FIG. 7, the DLL circuit 200 includes a delay line 210 that delays the internal clock signal ICLK0 to generate the internal clock signal ICLK1. The delay line 210 is a circuit that generates the internal clock signal ICLK1 by providing a delay corresponding to a count value COUNT of the counter circuit 220 to the internal clock signal ICLK0.

The internal clock signal ICLK1 is supplied to the output buffer circuit 30a shown in FIG. 2 and is supplied also to a replica buffer circuit 230. The replica buffer circuit 230 generates an internal clock signal RCLK as a replica based on the internal clock signal ICLK1 and has the same characteristics as the output buffer circuit 30a. Because the output buffer circuit 30a outputs read data DQ in synchronism with the internal clock signal ICLK1, the internal clock signal RCLK output from the replica buffer circuit 230 is precisely synchronized with the read data DQ. In a DRAM, read data DQ needs to be precisely synchronized with the external clock signals CK and CKB and, when phase shifting occurs therebetween, the phase shifting needs to be detected and corrected. This detection is performed by the phase comparing circuit 240 and a result thereof is fed back to the counter circuit 220 through a DLL control circuit 250 to correct the phase shifting.

The phase comparing circuit 240 compares phases of the internal clock signal ICLK0 and the internal clock signal RCLK with each other and generates a phase determination signal PD based on a comparison result. The internal clock signal ICLK0 has the same timing as the external clock signals CK and CKB, and the internal clock signal RCLK has the same timing as read data DQ, which implies that the phase comparing circuit 240 indirectly compares phases of the external clock signals CK and CKB and the read data DQ with each other. When the comparison result indicates that the internal clock signal RCLK is behind the internal clock signal ICLK0, the phase determination signal PD is set to one of logic levels (a low level, for example). In response thereto, the DLL control circuit 250 counts down a count value of the counter circuit 220, thereby reducing a delay amount of the delay line 210. Conversely, when the internal clock signal RCLK is ahead of the internal clock signal ICLK0, the phase determination signal PD is set to the other logic level (a high level, for example). In response thereto, the DLL control circuit 250 counts up a count value of the counter circuit 220, thereby increasing a delay amount of the delay line 210. When phases of the internal clock signal ICLK0 and the internal clock signal RCLK are aligned with each other by periodically repeating this operation, phases of the read data DQ and the external clock signals CK and CKB are consequently aligned with each other.

The operation of the DLL control circuit 250 is controlled by a read signal RD, the update start signal ST, and the reset signal RST. The read signal RD is activated when a read command is issued and the DLL control circuit 250 continues the update operation of the counter circuit 220 while the read signal RD is activated. This corresponds to the first active state mentioned above and the internal clock signal ICLK1 phase-controlled is continuously generated. On the other hand, the update start signal ST is periodically activated during the periods in which the semiconductor device 10 is not in the self-refresh mode and, when the update start signal ST is activated, the DLL control circuit 250 performs the update operation of the counter circuit 220 for a predetermined period or a predetermined number of times. This corresponds to the second active state mentioned above and is performed to eliminate phase shifting caused by temperature or voltage changes. After the update operation of the counter circuit 220 is performed for the predetermined period or the predetermined number of times and thus the internal clock signal ICLK1 acquires a desired phase, the DLL control circuit 250 generates the update end signal END. At that time, the counter circuit 220 is not reset and transits to an inactive state with a count value at the time of generation of the update end signal END kept. Therefore, when the update start signal ST is periodically performed, the internal clock signal ICLK1 phase-controlled can be promptly generated when the read signal RD is issued.

The reset signal RST is activated when the DLL circuit 200 is to be entirely initialized and generated by the self-refresh control circuit 100. When the reset signal RST is activated, the count value of the counter circuit 220 is reset to an initial value and then the DLL circuit 200 is activated until the internal clock signal ICLK1 phase-controlled is generated. That is, previous update information is electrically discarded. Therefore, once the reset signal RST is activated, a certain time is required to enable output of the internal clock signal phase-controlled. The reset signal RST is automatically generated within the semiconductor device 10 and activated also when a reset command is issued from the controller 50.

The circuit configuration of the access control circuit 20 according to the first embodiment is as described above. An operation of the access control circuit 20 according to the first embodiment is explained next.

Figure 8:
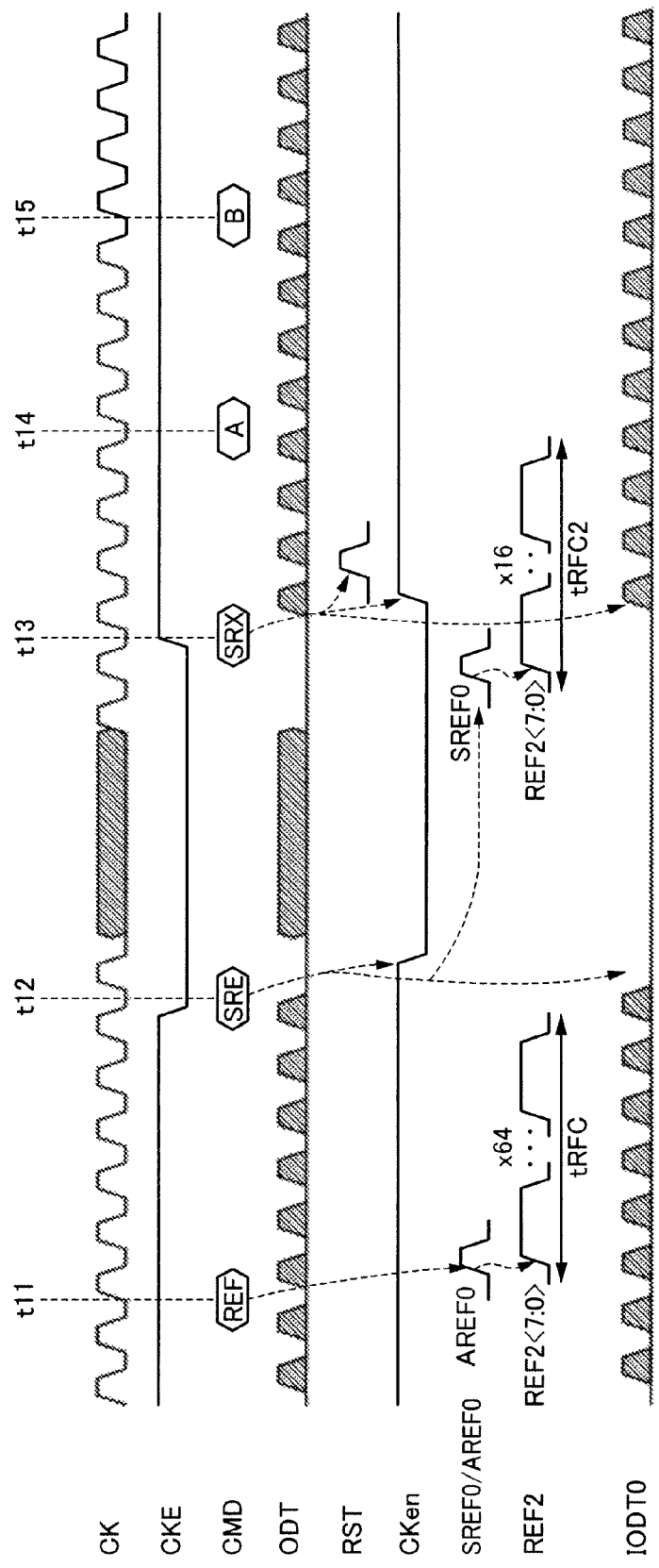
FIG. 8 is a timing chart for explaining an operation of the access control circuit 20 shown in FIG. 3.

Turning to FIG. 8, the auto-refresh command REF is issued at a time t11, the self-refresh command SRE is issued at a time t12, and the self-refresh exit command SRX is issued at a time t13. Therefore, the semiconductor device 10 is in the self-refresh mode during a period of time from t12 to t13 and the semiconductor device 10 is not in the self-refresh mode during other periods.

During the periods in which the semiconductor device 10 is not in the self-refresh mode, the SR latch circuit L1 shown in FIG. 6 is reset and thus the enable signal CKen is fixed to a high level. Accordingly, the input buffer circuits 71 and 72 shown in FIG. 3 are in an active state and the external clock signals CK and CKB and the impedance control signal ODT can be input from the controller 50. The impedance control signal IODT0 is latched by the ODT latch circuit 82 in synchronism with the internal clock signal ICLK0, and the impedance control signal IODT0 as a latched signal is supplied to the output buffer circuit 30a. Therefore, the impedance control signal ODT needs to be input in synchronism with a rising edge of the external clock signal CK. Accordingly, input of the impedance control signal ODT is effective during a period in which a setup margin and a hold margin from a rising edge of the external clock signal CK are ensured, and is ineffective in other periods. In FIG. 8, the periods in which input of the impedance control signal ODT is ineffective (Don't care) are shown by hatching. In the example shown in FIG. 8, the impedance control signal ODT is not input (that is, Don t care) in most of the period when the semiconductor device 10 is in the self-refresh mode. The impedance control signal CDT cannot be supplied from the controller 50 in most of the period when the semiconductor device 10 is in the self-refresh mode because the input buffer circuit 72 is inactivated in this period. Specifically, logic of generating the enable signal CKen shown in FIG. 3 is simplified to facilitate understanding, and the input buffer circuit 72 shown in FIG. 3 is activated to introduce the impedance control signal ODT supplied from outside into the semiconductor device each time the self-refresh command SRE is issued at the time t12 and the self-refresh exit command SRX is issued at the time t13. The same holds true for the ODT latch circuit 82 that generates the impedance control signal IODT1 and the internal clock signal ICLK0 for controlling the CDT latch circuit 82. That is, the self-refresh control circuit 100 shown in FIG. 6 contributes to clear understanding of a difference from a self-refresh control circuit 100a according to the second embodiment shown in FIG. 12 and explained later, for example.

When the auto-refresh command REF is issued at the time t11, the auto-refresh signal AREF0 is activated. In response thereto, the auto-refresh counter 91 generates the auto-refresh signals AREF1<7:0> for the corresponding banks eight times and the row control circuit 95 supplies the active signals ACT<7:0> to the corresponding banks eight times. The refresh address is incremented in the row control circuit 95, which causes eight different word lines to be selected one after another in synchronism with the eight active signals ACT<7:0>. As a result, a total of 64 word lines are selected. That is, memory cells MC connected to a total of 64 word lines are refreshed. To select these 64 word lines, a refresh period tRFC is required. Therefore, issuance of other commands by the controller 50 is inhibited after the auto-refresh command REF is issued and before the refresh period tRFC passes.

When the self-refresh command SRE is issued at the time t12, the SR latch circuit L1 shown in FIG. 6 is set and the enable signal CKen is changed to a Low level. This inactivates the input buffer circuits 71 and 72 shown in FIG. 3, thereby reducing power consumption. The clock issuing unit 52 of the controller 50 may stop supply of the external clock signal CK which it is continuing supplying ti11 then in connection with issue of the self refresh command SRE at the time t12. Power consumption of the system can be reduced.

When the semiconductor device enters the self-refresh mode, the oscillator 150 periodically outputs the refresh signal SREF0. When the refresh signal SREF0 is activated, the self-refresh counter 92 generates a self-refresh signal SREF1<7:0> twice to each bank and the row control circuit 95 supplies the active signals ACT<7:0> to the corresponding banks twice. The refresh address is incremented in the row control circuit 95, which causes two different word lines to be selected one after another in synchronism with the two active signals ACT<7:0>. That is, memory cells MC connected to a total of 16 word lines are refreshed. A refresh period tRFC2 required to select 16 word lines is shorter than the refresh period tRFC required to select 64 word lines and is about a quarter thereof. Accordingly, a period when the oscillator 150 issues the refresh signal SREF0 is also reduced to a quarter of that in the normal DRAM.

When the self-refresh exit command SRX is issued at the time t13, the SR latch circuit L1 shown in FIG. 6 is reset, and the enable signal CKen is changed to the high level. This activates the input buffer circuits 71 and 72 and enables input of the external clock signal CK and the impedance control signal ODT.

Furthermore, the reset signal RST is output from the one-shot pulse generating circuit OP1 in response to change of reset of the SR larch circuit L1. As described above, the reset signal RST is for entirely initializing the DLL circuit 200 and, when the reset signal RST is activated, the count value of the counter circuit 220 is reset to an initial value. Accordingly, a certain time is required to enable output of the internal clock signal ICLK1 phase-controlled. In this example, issuance of the second command is inhibited until 512 clock cycles have passed from issuance of the self-refresh exit command SRX. The 512 clock cycles are longer than a maximum period required to lock the DLL circuit 200 after the DLL circuit 200 is reset. That is, when the 512 clock cycles have passed, it means that the DLL circuit 200 is definitely locked. In the example shown in FIG. 8, the second command B is issued at a time t15.

On the other hand, the command for performing an access to the memory cell array 11 based on a row address, that is, the first command cannot be issued at least until passage of the refresh period tRFC2 from issuance of the self-refresh exit command SRX. The first command is denoted by A in FIG. 8 and is issued at a time t14. In the second embodiment, a minimum period after the controller issues the self-refresh exit command SRX and before the first command A can be issued is tRFC2+10 ns, for example. That is, issuance of the first command A is allowed when tRFC2+10 ns have passed from issuance of the self-refresh exit command SRX.

Because tRFC2<tRFC, the period from issuance of the self-refresh exit command SRX until the first command can be input can be greatly reduced as compared to the normal DRAM.

Figure 9:
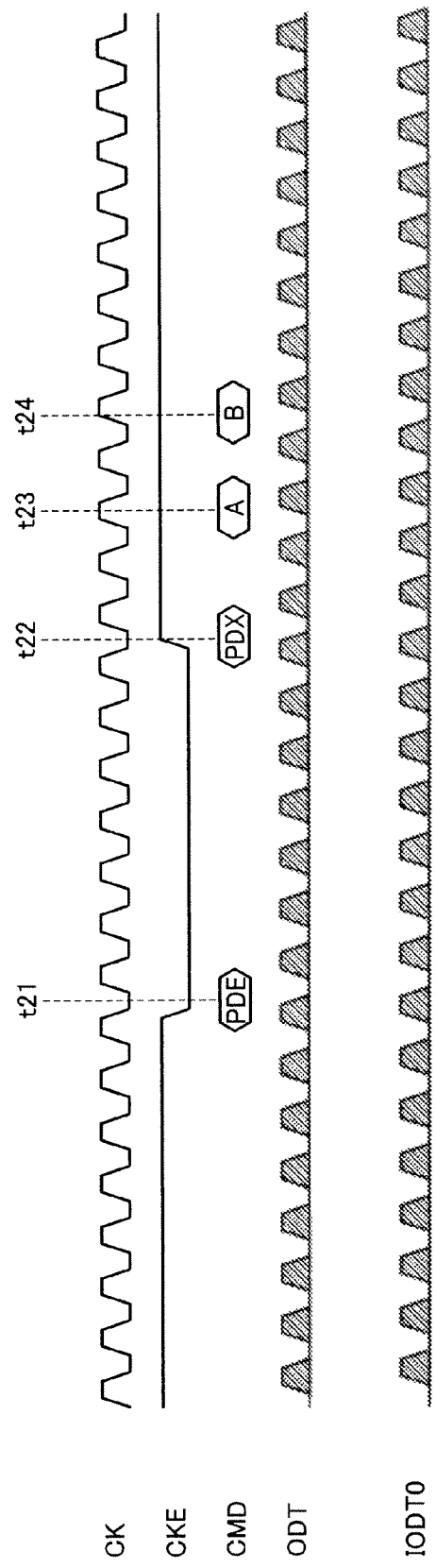
FIG. 9 is a timing chart for explaining an operation of the access control circuit 20 shown in FIG. 3.

Turning to FIG. 9, the power-down command PDE is issued at a time t21, the power-down exit command PDX is issued at a time t22, the first command A is issued at a time t23, and the second command B is issued at a time t24. Therefore, the semiconductor device 10 is in a power-down mode during a period of time from t21 to t22.

In this case, the power-down mode is an operation mode in which input of the first and second commands is inhibited as in the self-refresh mode compliant with the DRAM standards. Major differences of the power-down mode from the self-refresh mode are such that the controller needs to continuously supply the external clock signals CK and CKB to the semiconductor device 10 and can input the impedance control signal ODT in the power-down mode, and that the semiconductor device does not perform an automatic refresh operation (refresh of storage data), causes the DLL circuit to operate, and activates an input circuit (input buffer circuit) connected to an external terminal of the semiconductor device 10 while reducing power consumption of internal circuits of the semiconductor device 10 in the power-down mode and the like. For example, the input buffer circuit 71 connected to the clock terminals 23 and 24 is activated in the power-down mode and is inactivated in the self-refresh mode complying with the DRAM standards. Due to these differences, while a period before a command (the first command) can be input after power-down exit is advantageously shorter in the power-down mode than in the self-refresh mode, power consumption in the self-refresh mode is lower than in the power-down mode. This is particularly because the input buffer circuit 71 and the DLL circuit 200 are activated in the power-down mode.

A minimum period after the power-down exit command PDX is issued and before the first command A can be issued is shorter than a minimum period after the self-refresh exit command SRX is issued and before the first command A can be issued. Specifically, issuance of the first command A is allowed when, for example, 7.5 ns have passed after issuance of the power-down exit command PDX. This is because no refresh operation is performed in the power-down mode and thus a state where no refresh operation is performed is ensured at a time when the power-down exit command PDX is issued.

A minimum period after the power-down exit command PDX is issued and before the second command B can be issued is shorter than a minimum period after the self-refresh exit command SRX is issued and before the second command B can be issued. Specifically, issuance of the second command B is allowed when, for example, 24 ns have passed after issuance of the power-down exit command PDX. This is because the external clock signal CK is input in the power-down mode and thus the update operation of the DLL circuit 200 can be performed, which enables the DLL circuit 200 to be kept in a locked state.

Because not specified in the DRAM standards, the operation of the first embodiment mentioned above cannot ensure as it is compatibility with a DRAM complying with the standards. When this causes a problem, it is desirable to use a configuration that enables to switch between the operation of the first embodiment and the operation specified in the standards. That is, it suffices to design a circuit to perform the operation meeting the DRAM standards in the first operation mode and perform the operation of the first embodiment in the second operation mode.

When the first operation mode is selected, it suffices that a period in which the oscillator 150 issues the refresh signal SREF0 is matched with a quadruple of that in the second operation mode, that is, a performing period of the refresh operation in the self-refresh mode for a normal DRAM (about) 7.8 μs) and that an 8-bit counter is used instead of the 2-bit counter included in the self-refresh counter 92. Accordingly, when the refresh signal SREF0 is activated, eight different word lines are selected one after another in synchronism with eight active signals ACT<7:0>. That is, memory cells MC connected to a total of 64 word lines are refreshed, which is the same operation as that performed when the auto-refresh command REF is issued.

Figure 10:
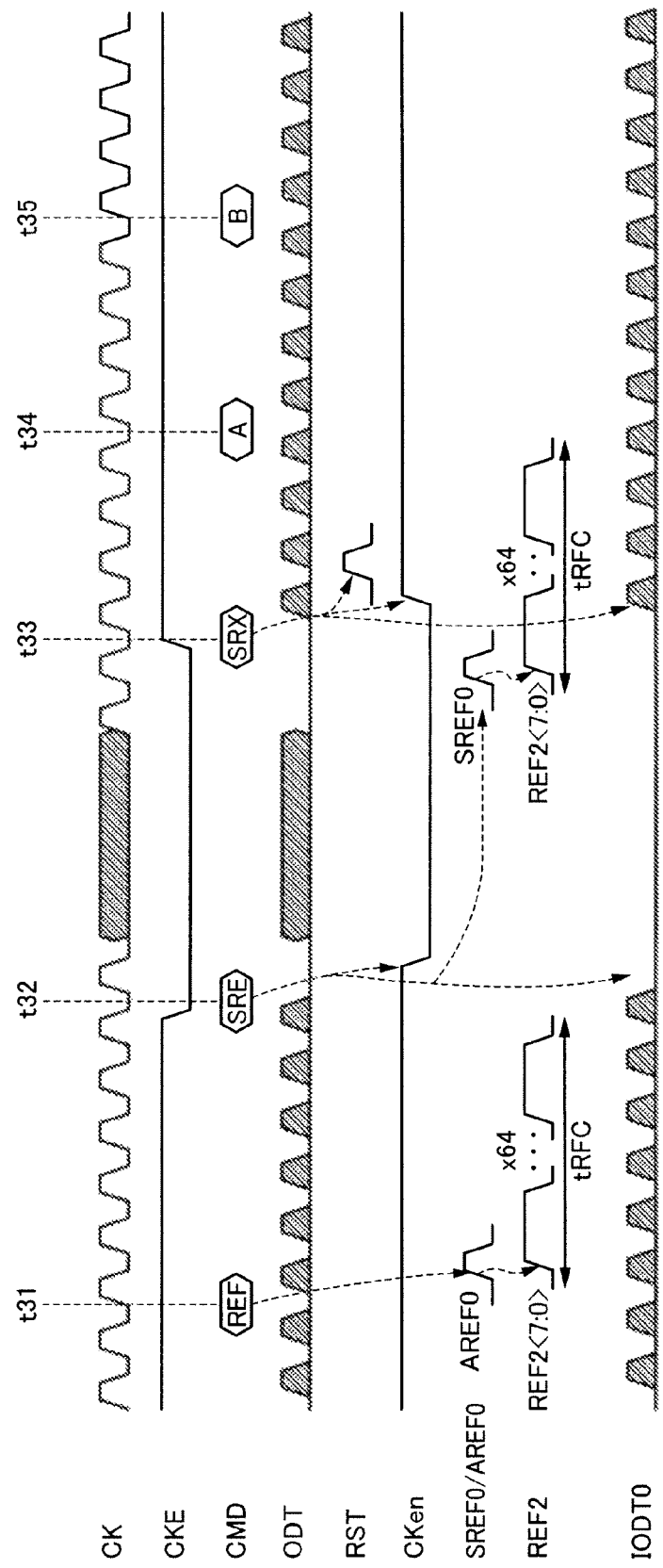
FIG. 10 is a timing chart for explaining an operation of the access control circuit 20 in the first operation mode.

Turning to FIG. 10, the auto-refresh command REF is issued at a time t31, the self-refresh command SRE is issued at a time t32, and the self-refresh exit command SRX is issued at a time t23. Therefore, the semiconductor device 10 is in the self-refresh mode during a period of time from t32 to t33 and the semiconductor device 10 is not in the self-refresh mode during other periods.

During the periods in which the semiconductor device 10 is not in the self-refresh mode, the SR latch circuit L1 shown in FIG. 6 is reset and thus the enable signal CKen is fixed to a high level. Accordingly, the input buffer circuits 71 and 72 shown in FIG. 3 are active. When the auto-refresh command REF is issued at the time t31 in this state, the auto refresh signal AREF0 is activated. An operation performed in this case is as explained with reference to FIG. 8.

When the self-refresh command SRE is issued at the time t32, the SR latch circuit L1 shown in FIG. 6 is set and the enable signal CKen is changed to a low level. This inactivates the input buffer circuits 71 and 72 shown in FIG. 3 and reduces power consumption. Furthermore, the refresh signal SREF0 is periodically output from the oscillator 150 and the same operation as in the case where the auto refresh signal AREF0 is activated is performed. While the refresh signal SREF0 is activated once in FIG. 10, the refresh signal SREF0 is periodically generated by the oscillator 150 during the period when the semiconductor device 10 has entered the self-refresh mode.

When the self-refresh exit command SRX is issued at the time t33, the SR latch circuit L1 shown in FIG. 6 is reset and the enable signal CKen is changed to the high level. This activates the input buffer circuits 71 and 72 and enables input of the external clock signal CK and the impedance control signal ODT. Furthermore, the reset signal RST is output from the one-shot pulse generating circuit OP1, thereby resetting the DLL circuit 200. Consequently, issuance of the second command is inhibited until the DLL circuit 200 is locked. In the example shown in FIG. 10, the second command B is issued at a time t35. A minimum period after the self-refresh exit command SRX is issued and before the second command B can be issued is the same between the first operation mode and the second operation mode.

On the other hand, the command for performing an access to the memory cell array 11 based on a row address, that is, the first command cannot be issued at least until passage of the refresh period tRFC from issuance of the self-refresh exit command SRX. This is because the refresh operation is performed in asynchronism with the external clock signal CK during the self-refresh mode and thus the refresh operation may be performed when the self-refresh exit command SRX is issued. The first command is denoted by A in FIG. 10 and is input at a time t34. In the first operation mode, a minimum period after the self-refresh exit command SRX is issued and before the first command A can be issued is tRFC+10 ns, for example. That is, issuance of the first command A is allowed when tRFC+10 ns have passed from issuance of the self-refresh exit command SRX. Thus, A minimum period after the self-refresh exit command SRX is issued and before the first command A can be issued in the first operation mode is longer than that in the second operation mode.

As described above, when the first operation mode is selected, the time required after the self-refresh exit command SRX is issued and before the first command can be issued becomes longer than that in the second operation mode; however, compatibility with the existing DRAMs can be ensured because the operation compliant with the standards is performed.

In either case where the first or second operation mode is selected, frequencies of the external clock signals CK and CKB can be changed when the semiconductor device enters the self-refresh mode and then exits the self-refresh mode. This is because the external clock signals CK and CKB are not used during the entry into the self-refresh mode. However, the second operation mode is suitable for a case where entry into and exit from the self-refresh mode are often repeated and, considering this point, it is preferable that the frequencies of the eternal clock signals CK and CKB are not changed during the self-refresh mode in the second operation mode.

A second embodiment of the present invention is explained next.

Figure 11:
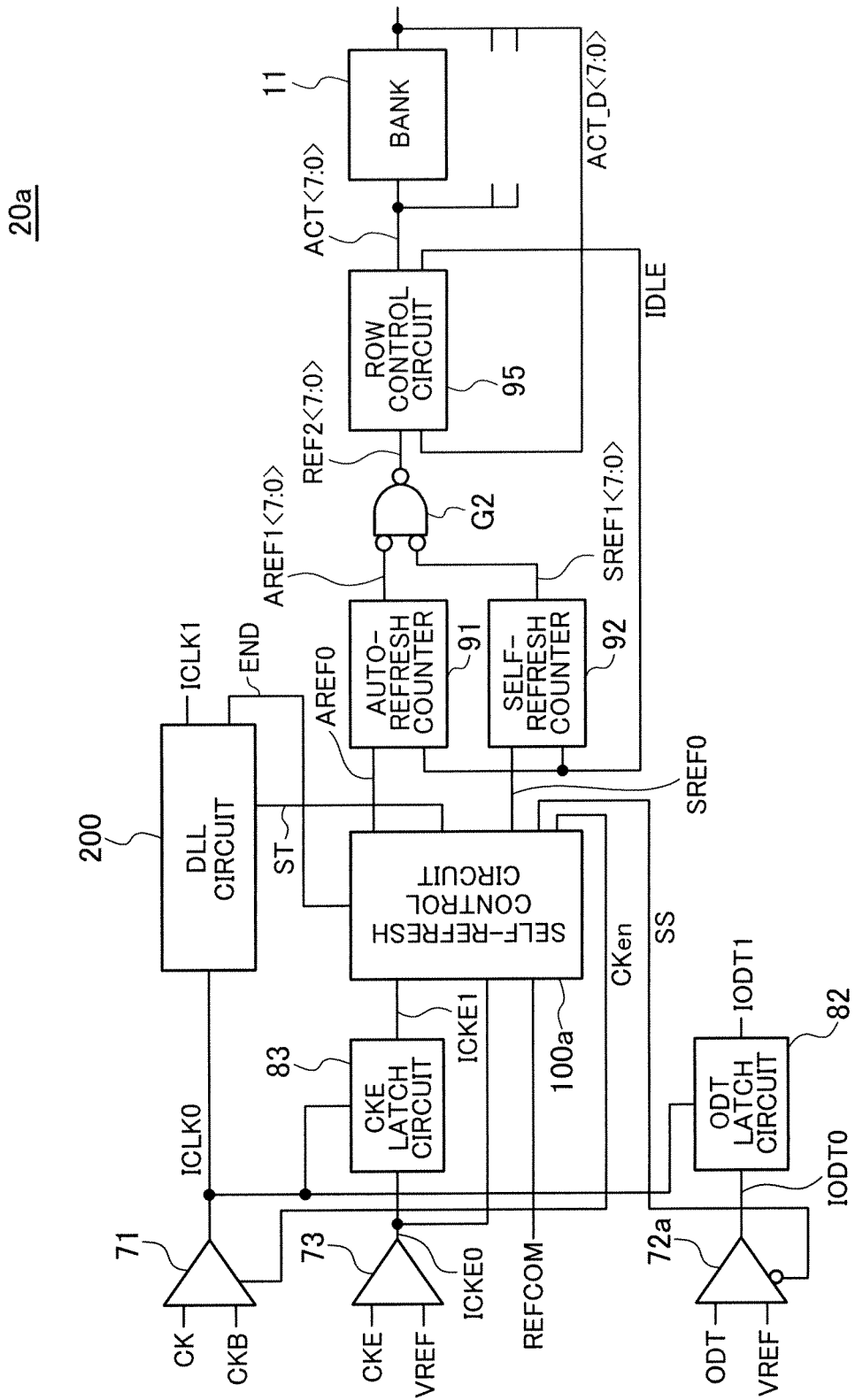
FIG. 11 is a block diagram indicative of an embodiment of main circuit blocks included in an access control circuit 20a according to a second embodiment.

Turning to FIG. 11, the access control circuit 20a uses a self-refresh control circuit 100a instead of the self-refresh control circuit 100. The self-state signal SS is output from the self-refresh control circuit 100a, and the input buffer circuit 72a is activated according to the self-state signal SS. The self-refresh control circuit 100a supplies an update start signal ST to the DLL circuit 200 and receives an update end signal END output from the DLL circuit 200. Other features of the access control circuit 20a are basically the same as those of the access control circuit 20 shown in FIG. 3, and therefore like elements are denoted by like reference characters and redundant explanations thereof will be omitted.

The input buffer circuit 72a is activated when the self-state signal SS has a low level and inactivated when the self-state signal SS has a high level. As described above, the input buffer circuit 71 and the input buffer circuit 72a are controlled independently in the present embodiment.

Figure 12:
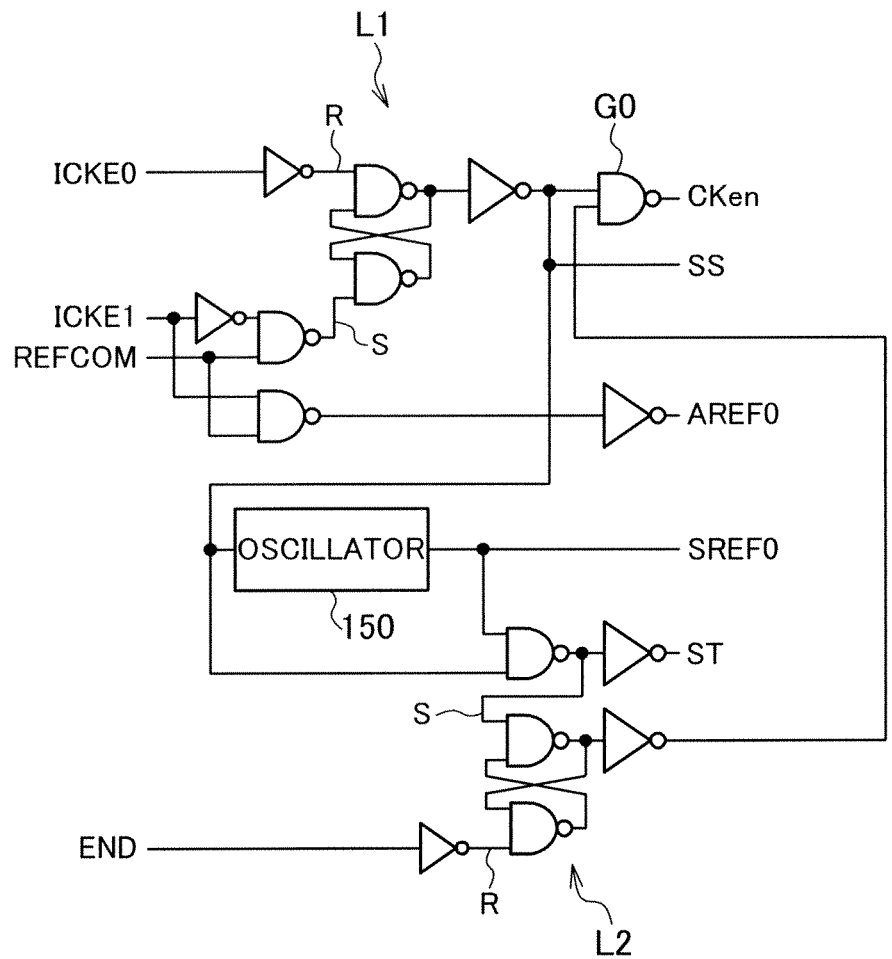
FIG. 12 is a main circuit diagram of indicative of an embodiment of a self-refresh control circuit 100a shown in FIG. 11.

Turning to FIG. 12, the self-refresh control circuit 100a is different from the self-refresh control circuit 100 shown in FIG. 6 in that an SR latch circuit L2 is used instead of the one-shot pulse generating circuit OP1 and that a NAND gate circuit G0 that receives outputs from the SR latch circuits L1 and L2 is added. The output from the SR latch circuit L1 is used as the self-state signal SS and an output from the NAND gate circuit G0 is used as the enable signal CKen. Other features of the self-refresh control circuit 100a are basically the same as those of the self-refresh control circuit 100 shown in FIG. 6, and therefore like elements are denoted by like reference characters and redundant explanations thereof will be omitted.

A signal indicating a negative AND of the self-state signal SS and the self-refresh signal SREF0 is input to the set node S of the SR latch circuit L2. An inverse signal of the update end signal END is input to the reset node R of the SR latch circuit L2. This causes the SR latch circuit L2 to be set each time the self-refresh signal SREF0 is activated and to be reset each time the update end signal END is activated in a state where the semiconductor device has entered the self-refresh mode.

A signal indicating an AND of the self-state signal SS and the self-refresh signal SREF0 is used as the update start signal ST. The update start signal ST is supplied to the DLL circuit 200 shown in FIG. 11.

Furthermore, outputs of the SR latch circuits L1 and L2 are supplied to a NAND gate circuit G0, and an output thereof is used as the enable signal CKen. Therefore, the enable signal CKen has a low level when the SR latch circuit L1 is set and the SR latch circuit L2 is reset. In other states, the enable signal CKen is always activated to a high level.

Figure 13:
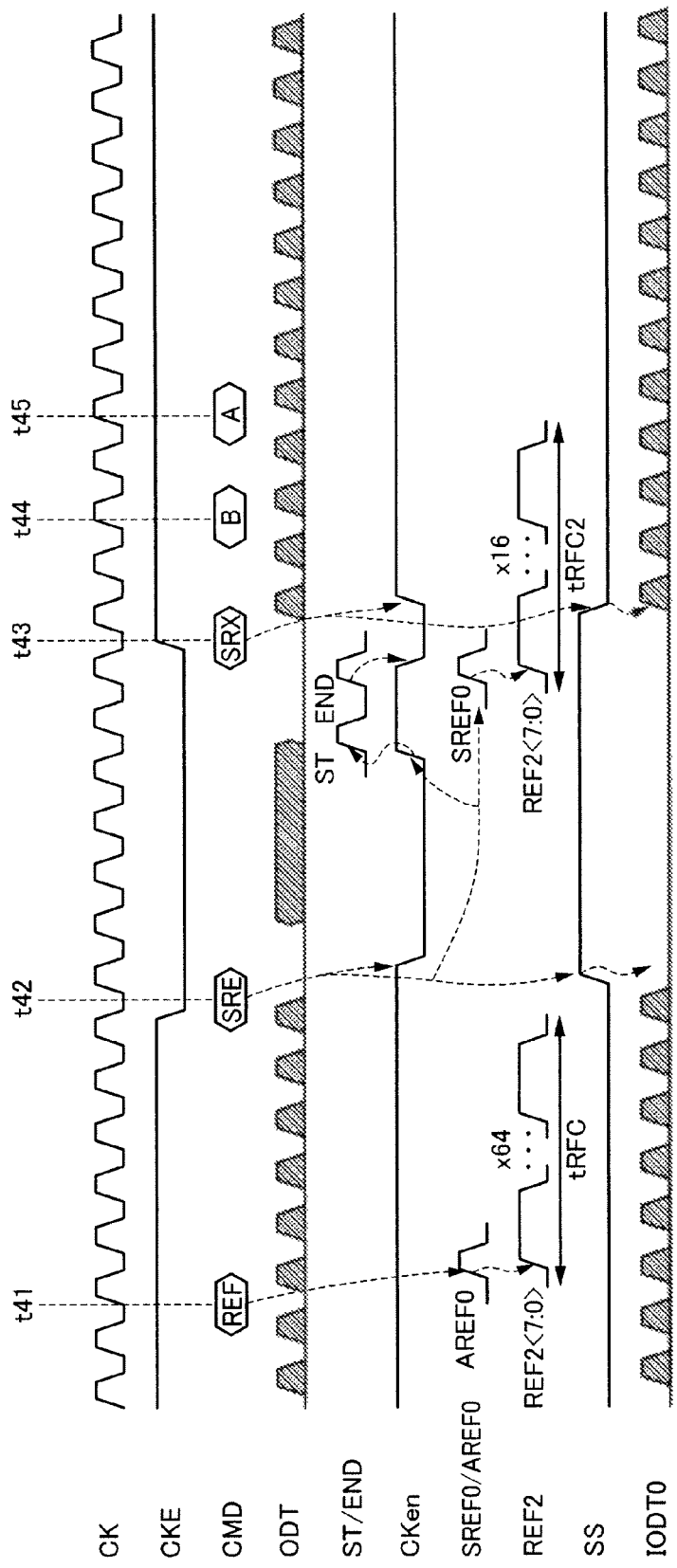
FIG. 13 is a timing chart for explaining an operation of the access control circuit 20a shown in FIG. 11.

Turning to FIG. 13, the auto-refresh command REF is issued at a time t41, the self-refresh command SRE is issued at a time t42, and the self-refresh exit command SRX is issued at a time t43. Therefore, the semiconductor device 10 is in the self-refresh mode during a period of time from t42 to t43 and the semiconductor device 10 is not in the self-refresh mode during other periods.

During the periods in which the semiconductor device 10 is not in the self-refresh mode, the SR latch circuit L1 shown in FIG. 12 is reset and thus the self-state signal SS is fixed to a low level. Accordingly, the input buffer circuit 72a shown in FIG. 11 is active and input of the impedance control signal ODT is enabled.

When the auto-refresh command REF is issued at the time t41 in this state, the auto refresh signal AREF0 is activated. An operation performed in this case is as explained with reference to FIG. 8.

When the self-refresh command SRE is issued at the time t42, the SR latch circuit L1 shown in FIG. 12 is set and the self-state signal SS is changed to a high level. This inactivates the input buffer circuit 72a shown in FIG. 11, thereby reducing power consumption. Furthermore, the enable signal CKen is changed to a low level because the SR latch circuit L2 is reset. This inactivates also the input buffer circuit 71 shown in FIG. 11, thereby reducing power consumption. In the example shown in FIG. 13, the impedance control signal ODT is not input (that is, Don't care) in most of the period when the semiconductor device 10 is in the self-refresh mode. The impedance control signal ODT cannot be supplied from the controller 50 in most of the period when the semiconductor device 10 is in the self-refresh mode because the input buffer circuit 72a is inactivated in this period. Specifically, logic of generating the self-state signal SS shown in FIG. 12 is simplified to facilitate understanding, and the input buffer circuit 72a shown in FIG. 11 is activated to introduce the impedance control signal ODT supplied from outside into the semiconductor device each time the self-refresh command SRE is issued at the time t42 and the self-refresh exit command SRX is issued at the time t43. The same holds true for the ODT latch circuit 82 that generates the impedance control signal IODT1, the internal clock signal ICLK0 for controlling the ODT latch circuit 82, and the enable signal CKen for generating the internal clock signal ICLK0. That is, the self-refresh control circuit 100a shown in FIG. 11 contributes to clear understanding of a difference from a self-refresh control circuit 100 compliant with the DRAM standards, which is shown in FIG. 11 and explained later, for example.

When the semiconductor device enters the self-refresh mode, the oscillator 150 periodically outputs the refresh signal SREF0. When the refresh signal SREF0 is activated, the access control circuit 20a performs the same operation as the case where it is operating in the second operation mode in the first embodiment. That is, a total of 16 word lines are selected one after another. Furthermore, when the refresh signal SREF0 is activated, the SR latch circuit L2 shown in FIG. 12 is set and thus the enable signal CKen is changed to a high level. This activates the input buffer circuit 71 shown in FIG. 11, thereby enabling reception of the external clock signal CK. Because the update start signal ST is also activated, the DLL circuit 200 generates the internal clock signal ICLK1 phase-controlled, based on the internal clock signal ICLK0 output from the input buffer circuit 71. That is, the update operation of the DLL circuit 200 is performed.

When the update operation of the DLL circuit 200 ends, the DLL circuit 200 outputs the update end signal END and then the SR latch circuit L2 is reset. This causes the enable signal CKen to be changed to the low level again, thereby inactivating the input buffer circuit 71. Therefore, power consumption of the input buffer circuit 71 can be reduced during periods other than an update time of the DLL circuit 200 performing self refresh. At that time, the counter circuit 220 is not reset and transits to an inactive state with a count value at the time of generation of the update end signal END kept.

While the refresh signal SREF0 is activated once in FIG. 13, the refresh signal SREF0 is periodically generated by the oscillator 150 during a period when the semiconductor device has entered the self-refresh mode. Accordingly, the input buffer circuit 71 and the DLL circuit 200 are activated each time the refresh signal SREF0 is generated. In this way, because the input buffer circuit 71 and the DLL circuit 200 are intermittently activated even when the semiconductor device has entered the self-refresh mode, the DLL circuit 200 can keep a locked state (a state where the internal clock signal ICLK0 and the internal clock signal RCLK have phases almost matched). In addition, because the input buffer circuit 71 and the DLL circuit 200 are not always activated but intermittently activated based on the refresh signal SREF0 during the self-refresh mode and are inactivated during other periods, useless power consumption can be avoided.

When the self-refresh exit command SRX is issued at the time t43, the SR latch circuit L1 shown in FIG. 12 is reset, the self-state signal SS is changed to the low level, and the enable signal CKen is changed to the high level. This activates the input buffer circuits 71 and 72a and enables input of the external clock signal CK and the impedance control signal ODT.

At that time, the DLL circuit 200 is already in the locked state and thus the controller can issue the command for controlling a state of the data terminal in synchronism with the internal clock signal ICLK1, that is, the second command in a short time. In the second embodiment, the DLL circuit is not reset in response to the self-refresh exit command SRX. The second command is denoted by B in FIG. 13 and is input at a time t44. A minimum period after the self-refresh exit command SRX is issued and before the second command B can be issued is 24 nanoseconds (ns), for example. That is, issuance of the second command B is allowed 24 ns after the self-refresh exit command SRX is issued.

On the other hand, a minimum period after the self-refresh exit command SRX is issued and before the first command can be input is the same as that in the case that the access control circuit 20a operates in the second operation mode. The first command is denoted by A in FIG. 13 and is input at a time t45. A minimum period after the self-refresh exit command SRX is issued and before the first command A can be issued is tRFC2+10 ns, for example. That is, issuance of the first command A is allowed when tRFC2+10 ns have passed from issuance of the self-refresh exit command SRX.

As described above, according to the second embodiment, in addition to the effect of the first embodiment, the input buffer circuit 71 and the DLL circuit 200 are intermittently activated in conjunction with each other and therefore the locked state of the DLL circuit 200 can be maintained during a period when the semiconductor device has entered the self-refresh mode. This enables issuance of the second command at a short time after the self-refresh exit command SRX is issued. In addition, the input buffer circuit 71 and the DLL circuit 200 are not always activated but intermittently activated in conjunction with each other based on the refresh signal SREF0, and are inactivated during other periods. Accordingly, increase in the power consumption can be minimized.

Also the operation of the second embodiment is not specified in the DRAM standards and thus it is desirable to use a configuration that enables switching between the operation of the second embodiment and the operation specified in the standards. That is, it suffices to design a circuit to perform the operation complying with the DRAM standards in the first operation mode and perform the operation of the second embodiment mentioned above in the second operation mode. The first operation mode is as already explained.

The third embodiment of the present invention is explained next.

Figure 14:
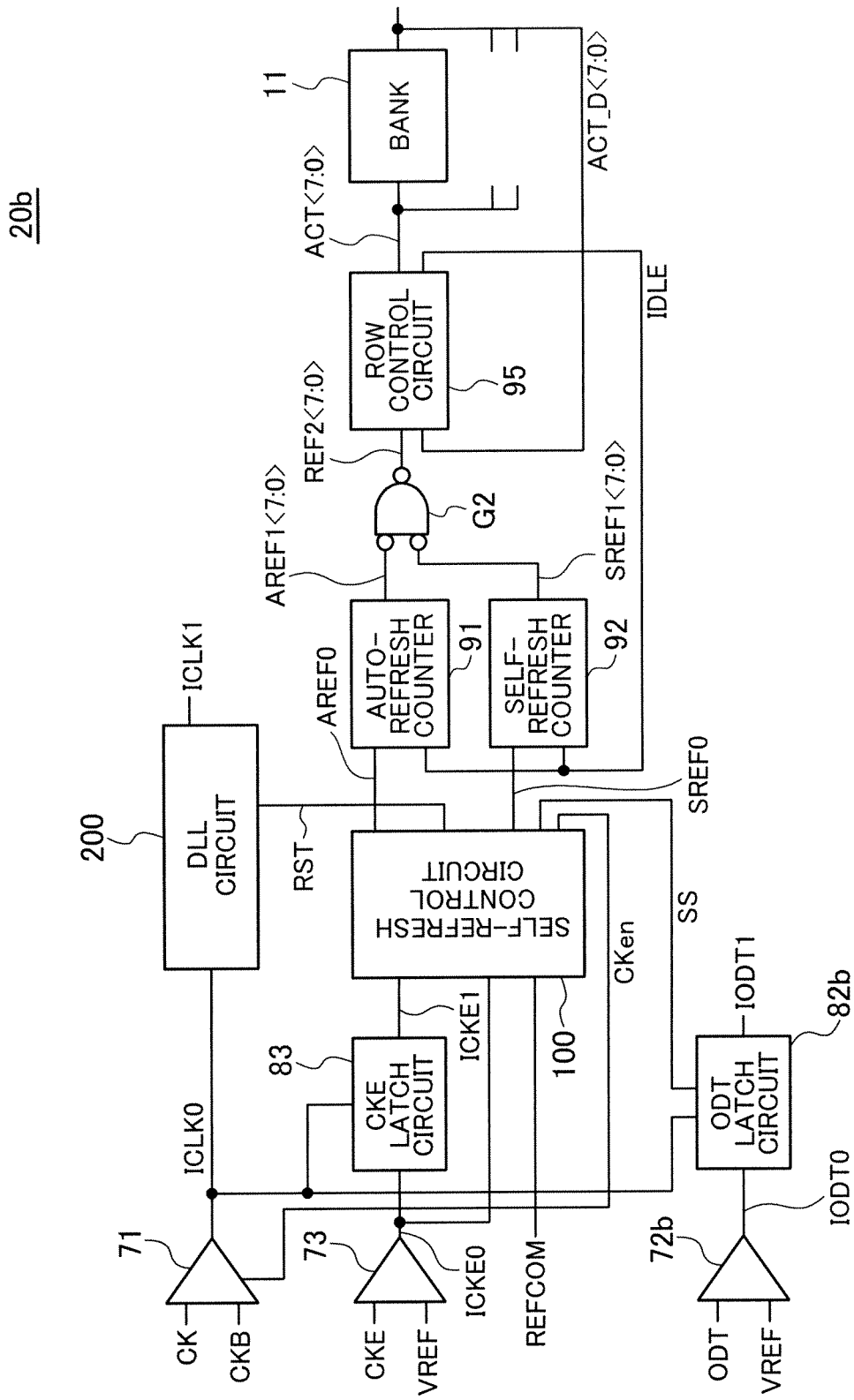
FIG. 14 is a block diagram indicative of an embodiment of main circuit blocks included in an access control circuit 20b according to a third embodiment.

The access control circuit 20b shown in FIG. 14 is different from the access control circuit 20 shown in FIG. 3 in that the input buffer circuit 72 is replaced by an input buffer circuit 72b and that the ODT latch circuit 82 is replaced by an ODT latch circuit 82b. Other features of the access control circuit 20b are basically the same as those of the access control circuit 20 shown in FIG. 3, and therefore like elements are denoted by like reference characters and redundant explanations thereof will be omitted. In the third embodiment, the input buffer circuit 72b is always activated and therefore the controller can input the impedance control signal ODT even during a period when the semiconductor device has entered the self-refresh mode. Accordingly, even when one of semiconductor devices has been entered the self-refresh mode, the controller can perform an impedance control of a data terminal of the semiconductor device and can issue the write command WT to the other semiconductor device. This enables the controller 50 to control the other semiconductor device while reducing power consumption.

Figure 15:
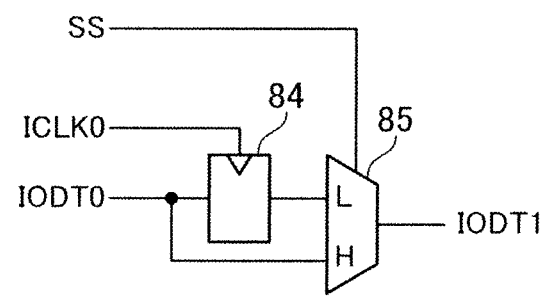
FIG. 15 is a circuit diagram indicative of an embodiment of an ODT latch circuit 82b.

Turning to FIG. 15, the ODT latch circuit 82b includes a latch circuit 84 and a selector 85. The latch circuit 84 latches the impedance control signal IODT0 in synchronism with the internal clock signal ICLK0. The selector 85 is a circuit that selects one of an output from the latch circuit 84 and the impedance control signal IODT0, and selection is performed based on the self-state signal SS. Specifically, the output from the latch circuit 84 is selected when the self-state signal SS has a low level and the impedance control signal IODT0 is selected when the self-state signal SS has a high level. This means that the output from the latch circuit 84 is used as the impedance control signal IODT1 during a period when the semiconductor device is not in the self-refresh mode and that the impedance control signal IODT0 is used as it is as the impedance control signal IODT1 during a period when the semiconductor device has entered the self-refresh mode.

Figure 16:
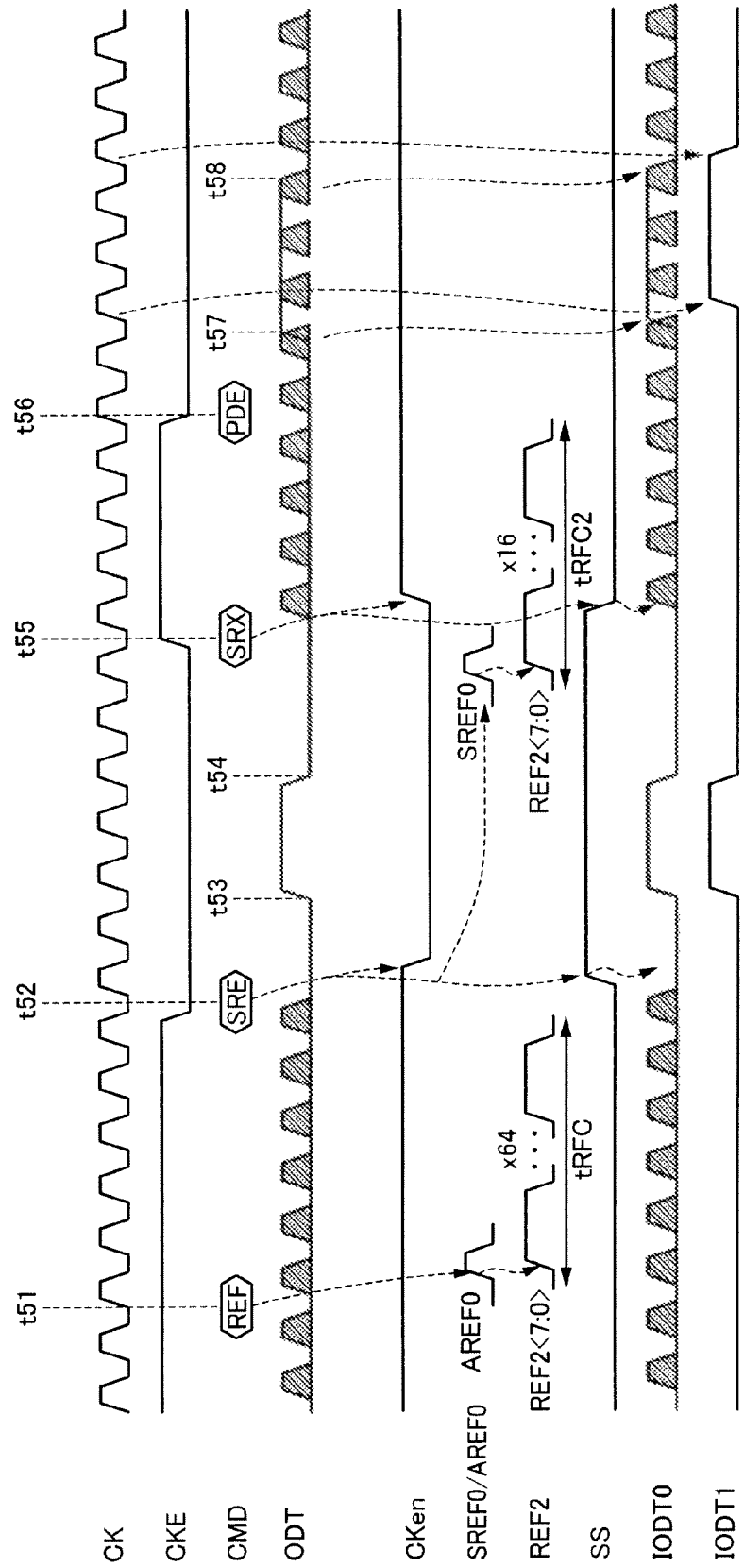
FIG. 16 is a timing chart for explaining an operation of the access control circuit 20b shown in FIG. 13.

Turning to FIG. 16, the auto-refresh command REF is issued at a time t51, the self-refresh command SRE is issued at a time t52, the self-refresh exit command SRX is issued at a time t55, and the power-down command PDE is issued at a time t56. Therefore, the semiconductor device 10 is in the self-refresh mode during a period of time from t52 to t55 and the semiconductor device 10 is in a power-down mode during a period after the time t56.

An operation performed before the semiconductor device enters the self-refresh mode is the same as that in the first embodiment. Therefore, when the auto-refresh command REF is issued at the time t51, the row control circuit 95 supplies the active signals ACT<7:0> eight times to the corresponding banks. This enables eight word lines to be selected one after another and memory cells MC connected to a total of 64 word lines to be refreshed.

Subsequently, when the self-refresh command SRE is issued at a time t52, the semiconductor devices enters the self-refresh mode. An operation performed by the semiconductor device 10 in response to the self-refresh command SRE is as mentioned above. The refresh operation is periodically performed and a performing period thereof is a quarter of that in the normal DRAM. The number of word lines selected in one refresh operation is 16 and therefore a refresh period tRFC2 required for one refresh operation is a quarter of the refresh period tRFC of the operation performed in response to the auto-refresh command REF.

Because the self-state signal SS is changed to a high level when the semiconductor device enters the self-refresh mode, the impedance control signal ODT supplied from the controller is introduced as it is as the impedance control signal IODT1. That is, the impedance control signal IODT1 is introduced independently of (in asynchronism with) the external clock signals CK and CKB. In an example shown in FIG. 16, the impedance control signal ODT is activated to a high level during a period of time from t53 to t54 and is internally used as it is as the impedance control signal IODT1. As a result, although the input buffer circuit 71 that receives the external clock signals CK and CKB is basically inactivated during the period when the semiconductor device has entered the self-refresh mode, the output buffer circuit 30a shown in FIG. 2 can perform an impedance control of the data terminal 31 independently of the external clock signals CK and CKB.

When the self-refresh exit command SRX is issued at the time t55, the input buffer circuit 71 is activated, input of the external clock signals CK and CKB is enabled, and the impedance control signal ODT is input in synchronism with the internal clock signal ICLK0. In addition, the DLL circuit 200 is reset as is the case with the first embodiment.

In this example, the power-down command PDE is issued at the time t56 and the impedance control signal ODT is activated to the high level during a period of time from t57 and t58 in which the semiconductor device has entered the power-down mode. Because the impedance control signal ODT is introduced in synchronism with the internal clock signal ICLK0 during this period, the output buffer circuit 30a shown in FIG. 2 can perform an impedance control of the data terminal 31 in synchronism with the external clock signals CK and CKB.

As described above, according to the third embodiment, the effect of the first embodiment mentioned above is obtained and also the controller can supply the impedance control signal ODT even during the period of the self-refresh mode. Even during the period of having entered the self-refresh mode, the semiconductor device can receive the impedance control signal ODT and perform the impedance control. Also the operation of the third embodiment is not specified in the DRAM standards and thus a configuration that enables switching between the operation of the third embodiment and the operation specified in the standards is desirable. That is, it suffices to design a circuit to perform the operation compliant with the DRAM standards in the first operation mode and perform the operation of the third embodiment in the second operation mode. The first operation mode is as already explained.

In the first embodiment (the first and second modes), the input buffer circuit 71 is always kept in an inactive state during the period when the semiconductor device has entered the self-refresh mode. Accordingly, the controller does not supply the external clock signals CK and CKB. This enables reduction in power consumption of the system. In the first embodiment, the external clock signals CK and CKB are not supplied to the semiconductor device and thus the DLL circuit 200 is also kept in an inactive state. Accordingly, power consumption during the period when the semiconductor device has entered the self-refresh mode in the first embodiment is reduced more than in that in the second embodiment. Because the input buffer circuit 72a is inactivated during the period when the semiconductor device has entered the self-refresh mode, the impedance control signal ODT cannot be input during this period. This means that, in a system that commonly uses data terminals of a plurality of semiconductor devices (that is, a configuration in which the data terminals of the semiconductor devices are commonly connected to a data bus of the system), when a controller causes one of the semiconductor devices to enter the self-refresh mode, for example, an impedance of the data terminal thereof cannot be adjusted and thus the write command WT cannot be issued to the other semiconductor device. This is because prevention of data reflection is essential in a system to which high frequency data are transferred. On the other hand, in a power-down mode, impedance adjustment of the data terminal can be performed during that period. Therefore, in this case, the controller selects the power-down mode in the first embodiment, instead of the self-refresh mode in which power consumption is low. From this viewpoint, accordingly, the third embodiment that the self-refresh mode with low power consumption be selected while impedance adjustment of the data terminal can be performed during the self-refresh mode is desirable.

An information processing system according to an embodiment of the present invention is explained next.

Figure 17:
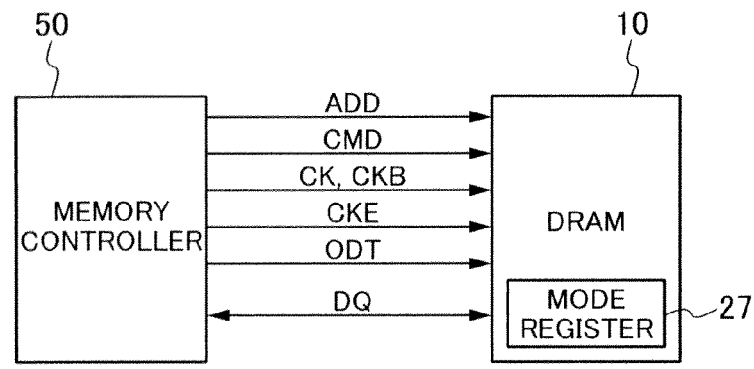
FIG. 17 is a block diagram indicative of a first preferred embodiment of an information processing system according to the present invention.

Turning to FIG. 17, the information processing system has a configuration in which one controller 50 and one semiconductor device (DRAM) 10 are used and are connected with each other. The controller 50 supplies the address signal ADD, the command signal CMD, the external clock signals CK and CKB, the clock enable signal CRE, and the impedance control signal ODT to the semiconductor device 10. The controller 50 sets the semiconductor device 10 to the first or second operation mode. When having set the semiconductor device 10 to the first operation mode, the controller 50 issues the command signal CMD and the like according to the DRAM standards. On the other hand, when having set the semiconductor device 10 to the second operation mode, the controller 50 issues the command signal CMD and the like at a timing not compliant with the DRAM standards, thereby realizing the operations explained in the first to third embodiments.

Selection of an operation mode can be performed by setting the operation mode in a mode register 27 included in the semiconductor device 10. Setting to the mode register 27 is performed by a method of issuing a mode-register set command (MRS) and inputting an operation mode to be set through the address terminal 21. According to this method, the first or second operation mode is selected at the time of initialization of the semiconductor device 10.

However, selection of an operation mode is not limited thereto and the first or second operation mode can be selected by a so-called on-the-fly method. That is, an additional signal that specifies the first or second operation mode can be issued using the address terminal 21 or the data terminal 31 when the self-refresh command SRE is issued, thereby selecting the first or second operation mode each time the semiconductor device enters the self-refresh mode.

Figure 18:
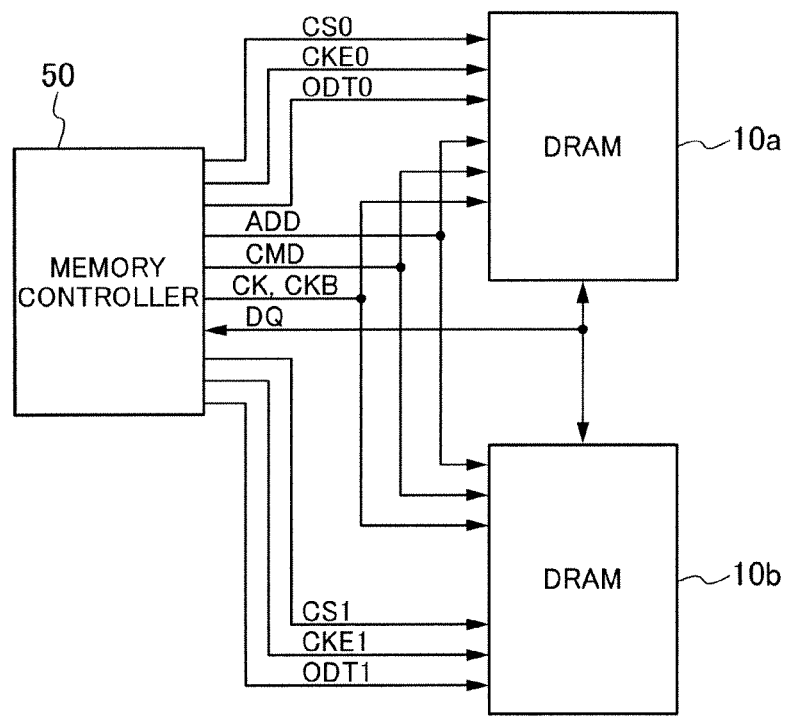
FIG. 18 is a block diagram indicative of a second preferred embodiment of an information processing system according to the present invention.

Turning to FIG. 18, two semiconductor devices (DRAMs) 10a and 10b are connected to one controller 50. The address signal ADD, the command signal CMD, the external clock signals CK and CKB from the controller 50 are commonly supplied to the two semiconductor devices 10a and 10b. The data terminals 31 of the semiconductor devices 10a and 10b are also commonly connected to the controller 50. On the other hand, the clock enable signal CKE and the impedance control signal CDT are separately supplied to the semiconductor devices 10a and 10b. That is, a clock enable signal CKE0 and an impedance control signal ODT0 are supplied to the semiconductor device 10a and a clock enable signal CKE1 and an impedance control signal ODT1 are supplied to the semiconductor device 10b. Selection of the semiconductor device 10a or 10b is performed by a chip select signal CS0 or CS1. That is, the command signal CMD or the like issued from the controller 50 becomes valid only for the semiconductor device 10a or 10b to which the chip select signal is activated.

Figure 19:
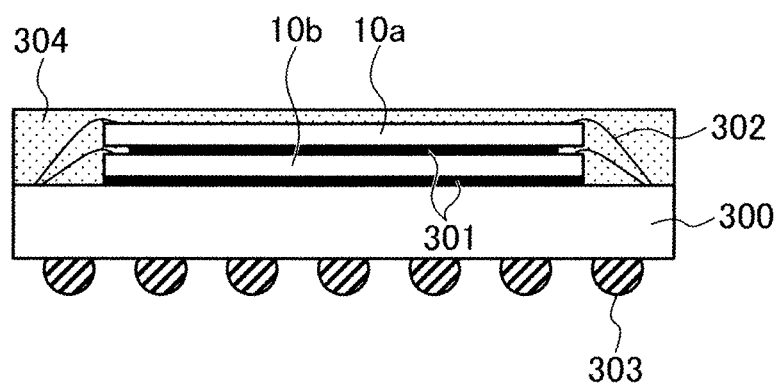
FIG. 19 is a schematic cross-sectional view for explaining a configuration of a dual-die package DDP, which is a package having two semiconductor devices 10a and 10b.

Turning to FIG. 19, the dual-die package DDP having a configuration in which the two semiconductor devices 10a and 10b are stacked on a package substrate 300 is shown. Between the semiconductor devices 10a and 10b and between the semiconductor device 10b and the package substrate 300, an adhesive 301 is interposed, which fixes the semiconductor devices 10a and 10b and the semiconductor device 10b and the package substrate 300 to each other. The semiconductor devices 10a and 10b and the package substrate 300 are connected with a bonding wire 302, which electrically connects the semiconductor devices 10a and 10b to external terminals 303 through an internal wire (not shown) provided in the package substrate 300. A sealing resin 304 is provided on the package substrate 300 to protect the semiconductor devices 10a and 10b and the bonding wire 302.

Figure 20:
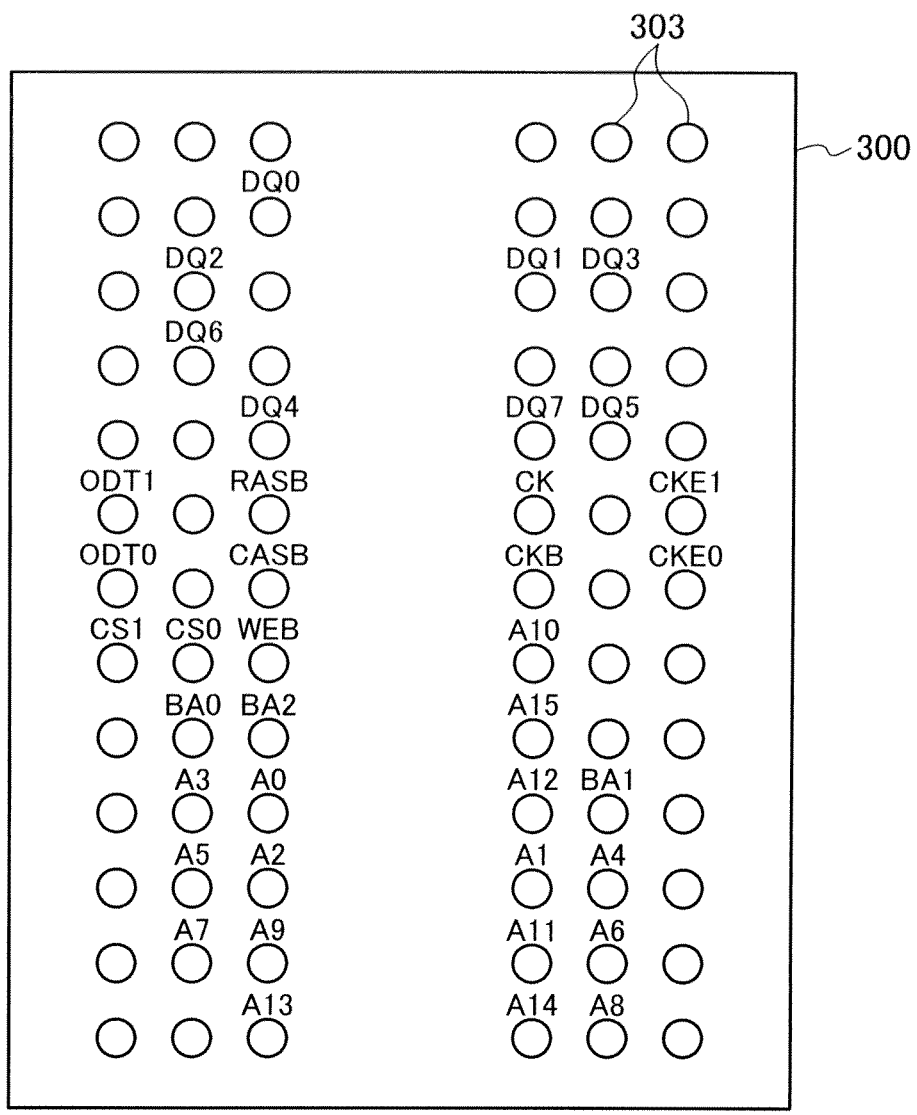
FIG. 20 is a schematic plan view showing an example of a layout of the external terminals 303 provided on the dual-die package DDP.

Turning to FIG. 20, the external terminals 303 are laid out in a matrix on the dual-die packaged DDP. Among these terminals, those related to the address signal ADD, the command signal CMD, the external clock signals CK and CKB, and data DQ are provided commonly for the semiconductor devices 10a and 10b. On the other hand, those related to the clock enable signal CKE, the impedance control signal ODT, and the chip select signal CS are provided separately for the semiconductor devices 10a and 10b. Therefore, even when only one of the semiconductor devices 10a and 10b has entered the self-refresh mode, the external clock signals CK and CKB are continuously supplied to both of the semiconductor devices 10a and 10b. Accordingly, it can be said that this configuration has high compatibility with the second embodiment mentioned above.

For example, when the semiconductor device 10a has entered the self-refresh mode and the semiconductor device 10b has not entered the self-refresh mode, the DLL circuit 200 and the input buffer circuit 71 of the semiconductor device 10a are intermittently activated during the self-refresh mode by utilizing the external clock signals CK and CKB continuously supplied also to the semiconductor device 10a, so that the locked state of the DLL circuit 200 can be maintained. When it is configured to enable input of the impedance control signal ODT even in the self-refresh mode as in the third embodiment, the impedance control signal ODT0 or ODT1 can be set to a high level, thereby performing an impedance control of the output buffer circuit 30a, even when both of the semiconductor devices 10a and 10b have entered the self-refresh mode.

Figure 21:
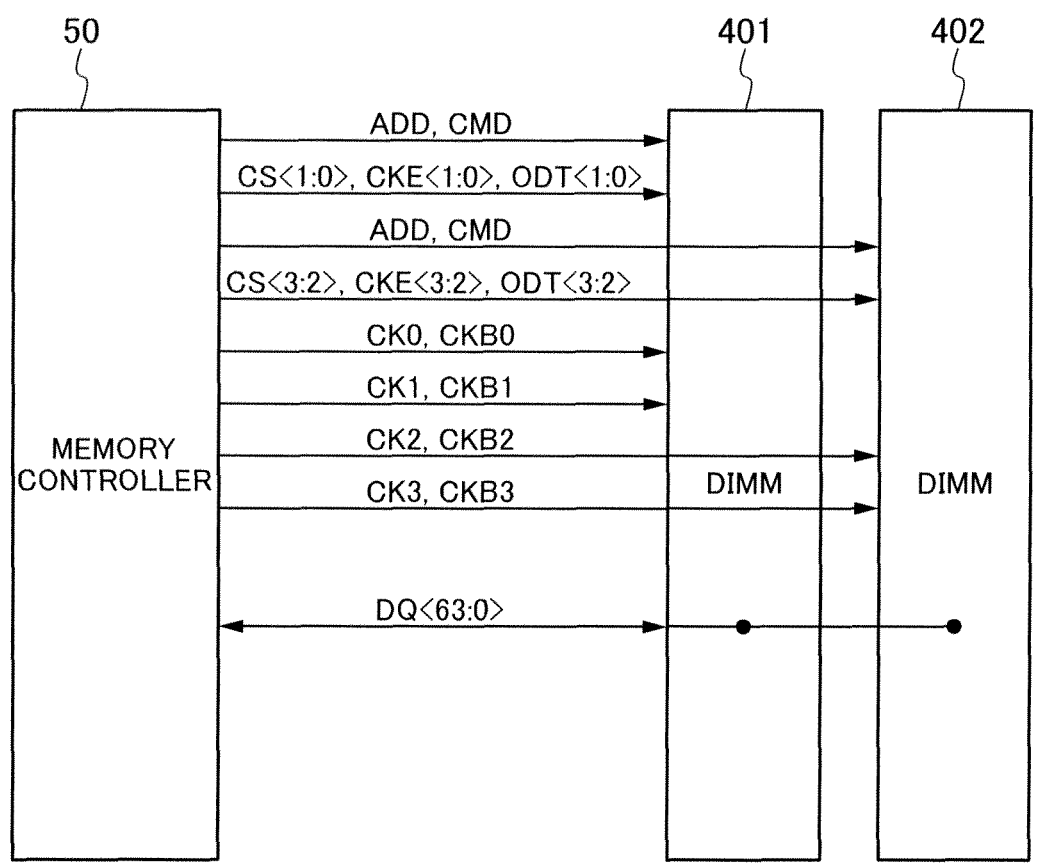
FIG. 21 is a block diagram indicative of a third preferred embodiment of an information processing system according to the present invention.

Turning to FIG. 21, two DIMMs (Dual Inline Memory Modules) 401 and 402 are connected to one controller 50. For example, 16 semiconductor devices (DRAMs) 10 are mounted on each of the DIMMs 401 and 402. Each of the DIMMs 401 and 402 has a two-rank configuration and accordingly there are four ranks in total. One rank is composed of eight semiconductor devices 10, for example, which are arranged on one of surfaces of a module substrate although not particularly limited thereto. A rank is exclusively selected by chip select signals CS0 to CS3.

The address signal ADD and the command signal CMD from the controller 50 are supplied to each of the DIMMs 401 and 402. On the other hand, the external clock signals CK and CKB are supplied to each rank. The data terminals 31 are commonly supplied to the controller 50 in the four ranks.

Turning to FIGS. 22A to 22C, when a write operation is performed for the DIMM 401, one of the ranks (the rank 1 in FIG. 22A) in the DIMM 401 is terminated to 120 ohms (Ω) and one of the ranks (the rank 2 in FIG. 22A) in the DIMM 402 is terminated to 30Ω as shown in FIG. 22A. When a write operation is performed for the DIMM 402, one of the ranks (the rank 2 in FIG. 22B) in the DIMM 401 is terminated to 30 Ω and one of the ranks (the rank 1 in FIG. 22B) in the DIMM 402 is terminated to 120Ω as shown in FIG. 22B.

As shown in FIG. 22C, when a read operation is performed for the DIMM 401, one of the ranks (the rank 2 in FIG. 22C) in the DIMM 402 is terminated to 30Ω. When a read operation is performed for the DIMM 402, one of the ranks (the rank 2 in FIG. 22D) in the DIMM 401 is terminated to 30Ω as shown in FIG. 22D.

In this example, even when one of the DIMMs 401 and 402 is to be accessed, the other one of the DIMMs 401 and 402 needs to be functioned as a terminating resistor. Such a control is particularly required when an operating frequency is high. When this control is required, ranks that do not need to be accessed can be entered into the self-refresh mode in which power consumption is much lower than in the power-down mode by using the semiconductor device according to the third embodiment. That is, in the semiconductor device according to the third embodiment, the impedance control signal ODT can be input even when the semiconductor devices has entered the self-refresh mode and thus a desired terminating resistance can be obtained by outputting the impedance control signal ODT from the controller 50 in synchronism with a read operation or a write operation for another rank.

It is apparent that the present invention is not limited to the above embodiments, but may be modified and changed without departing from the scope and spirit of the invention.

For example, while the number of memory cells to be refreshed in response to the self-refresh command SRE is a quarter of that of memory cells to be refreshed in response to the auto-refresh command REF in the above embodiments, the present invention is not limited thereto.

Furthermore, a PLL circuit can be used instead of the DLL circuit. The controller 50 can have functions other than that of controlling a memory.

The technical concept of the present invention can be applied to a semiconductor device having various functional chips, a controller thereof, and a system thereof. Furthermore, the configuration of each circuit disclosed in the drawings is not limited to the circuit form disclosed in the above embodiments.

The technical concept of the system of the present invention may be applied to various semiconductor devices. For example, the present invention can be applied to a general system including a CPU (Central Processing Unit), an MCU (Micro Control Unit), a DSP (Digital Signal Processor), an ASIC (Application Specific Integrated Circuit), and an ASSP (Application Specific Standard Product), a Memory and the like. An SOC (System on Chip), an MCP (Multi Chip Package), and a POP (Package on Package) and so on, and a module on which they are applied are pointed to as examples of types of system to which the present invention is applied. The present invention can be applied to the system that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following controllers, control methods thereof, control methods of an information processing system, and semiconductor devices:

A1. A controller comprising a command issuing unit that issues at least a self-refresh command that causes a semiconductor device to enter a self-refresh mode in which a refresh operation of storage data in memory cell array is periodically performed asynchronously with the clock signal, a self-refresh exit command that causes the semiconductor device to exit the self-refresh mode, and a first command that causes the semiconductor device to perform an access operation to the memory cell array, wherein the command issuing unit, in a first operation mode, issues the first command after elapse of a first period at earliest from issuing the self-refresh exit command, and the command issuing unit, in a second operation mode, issues the first command after elapse of a second period that is shorter than the first period at earliest from issuing the self-refresh exit command.

A2. The controller as A1, further comprising a clock signal issuing unit that issues a clock signal having a predetermined frequency, wherein the clock signal issuing unit, in the first operation mode, stops issuing the clock signal or changes a frequency thereof in at least a part of period while the semiconductor device is in the self-refresh mode, and the clock signal issuing unit, in the second operation mode, continuously issues the clock signal without changing the frequency while the semiconductor device is in the self-refresh mode.

A3. The controller as A2, wherein the command issuing unit further issues a second command that causes the semiconductor device to output the storage data through a data terminal or to control an impedance of the data terminal, the command issuing unit, in the first operation mode, issues the second command after elapse of a third period at earliest from issuing the self refresh exit command, and the command issuing unit, in the second operation mode, issues the second command after elapse of a fourth period that is shorter than the third period at earliest from issuing the self-refresh exit command.

A4. The controller as any one of A1 to A3, wherein the command issuing unit further issues a mode-register set command to set the semiconductor device in the first or second operation mode.

A5. The controller as any one of A1 to A3, wherein the command issuing unit further issues an additional signal that specifies the first or second operation mode along with the self-refresh command.

A6. The controller as A5, further comprising a data processor that processes the storage data transmitted to or received from the semiconductor device through a data line, and an address processor that specifies an address of the storage data, wherein the data processor or the address processor issues an additional signal that specifies the first or second operation mode along with the self-refresh command.

A7. The controller as A3, further comprising a data processor that processes the storage data transmitted to or received from the semiconductor device through a data line, wherein the second command is an impedance control signal that controls an impedance of the data terminal, and when the controller is in the second operation mode, the command issuing unit issues the impedance control signal in at least a part of period while the semiconductor device is in the self-refresh mode.

A8. The controller as A7, wherein when the controller is in the first operation mode, the command issuing unit does not issue the impedance control signal while the semiconductor device is in the self-refresh mode.

A9. The controller as A7 or A8, wherein the command issuing unit issues the impedance control signal while the semiconductor device is not in the self-refresh mode.

A10. The controller as A1, further comprising a clock signal issuing unit that issues a clock signal having a predetermined frequency, wherein the clock signal issuing unit issues the clock signal to first and second semiconductor devices in common.

A11. The controller as any one of A7 to A9, wherein the command issuing unit issues different one of the impedance control signals to first and second semiconductor devices, respectively.

A12. The controller as A11, wherein the controller issues first and second clock signals to first and second semiconductor devices, respectively.

A13. A control method of a controller, the method comprising:

setting a semiconductor device to a first or a second operation mode, the semiconductor device having a self-refresh mode in which a refresh operation of storage data is periodically performed;

issuing a self-refresh command that causes the semiconductor device to enter the self-refresh mode;

issuing a self-refresh exit command that causes the semiconductor device to exit the self-refresh command;

issuing a first command that causes the semiconductor device to perform an access operation to the storage data while the semiconductor device is not in the self-refresh mode;

issuing the first command after elapse of a first period at earliest from issuing the self-refresh exit command while the semiconductor device is in the first operation mode; and issuing the first command after elapse of a second period that is shorter than the first period at earliest from issuing the self-refresh exit command while the semiconductor device is in the second operation mode.

A14. The control method of a controller as A13, the method further comprising issuing a clock signal having a predetermined frequency to the semiconductor device, wherein the controller, in the first operation mode, stops issuing the clock signal or changes a frequency thereof while the first device is in the self-refresh mode, and the controller, in the second operation mode, continuously issues the clock signal having the predetermined frequency without stopping the clock signal whether the first device is in the self-refresh mode or not.

A15. The control method of a controller as A14, the method further comprising:

issuing a second command that causes the semiconductor device to output the storage data through a data terminal or to control an impedance of the data terminal;

issuing the second command after elapse of a third period at earliest from issuing the self-refresh exit command while the semiconductor device is in the first operation mode; and issuing the second command after elapse of a fourth period that is shorter than the third period at earliest from issuing the self-refresh exit command while the semiconductor device is in the second operation mode.

A16. The control method of a controller as one any of A13 to A15, the method further comprising issuing a mode-register set command that sets the semiconductor device to the first or second operation mode.

A17. The control method of a controller as any one of A13 to A15, the method further comprising issuing an additional signal that sets the semiconductor device to the first or second operation mode along with the self-refresh command.

A18. The control method of a controller as any one of A13 to A17, the method further comprising:

issuing an impedance control signal that controls an impedance of a data terminal provided in the semiconductor device while the semiconductor device is not in the self-refresh mode; and issuing the impedance control signal while the semiconductor device is in the self-refresh mode and in the second operation mode, wherein the controller does not issue the impedance control signal during a period while the semiconductor device is in the self-refresh mode and in the first operation mode.

A19. A control method of an information processing system having a controller and a semiconductor device, wherein the controller issues an auto-refresh command, a self-refresh command, and a self-refresh exit command to the semiconductor device, the semiconductor device performs a refresh operation on n memory cells included in a memory cell array in response to the auto-refresh command, the semiconductor device enters an self-refresh mode in response to the self-refresh command, and exits the self-refresh mode in response to the self-refresh exit command, and the semiconductor device periodically performs the refresh operation on m memory cells included in the memory cell array for each first cycle during the self-refresh mode asynchronously with an external clock signal having a predetermined frequency, where m is smaller than n.

A20. The control method of an information processing system as A19, wherein the controller setting the semiconductor device to a first or second operation mode, the semiconductor device periodically performs the refresh operation on the n memory cells while changing addresses for each second cycle that is longer than the first cycle asynchronous with the external clock signal, in the first operation mode, and the semiconductor device periodically performs the refresh operation on the m memory cells while changing addresses for each first cycle asynchronous with the external clock signal, in the second operation mode.

A21. The control method of an information processing system as A20, wherein the controller further issues a first command that causes the semiconductor device to perform an access operation to the storage data, the controller issues the first command after elapse of a first period at earliest from issuing the self-refresh exit command while the semiconductor device is in the first operation mode, and the controller issues the first command after elapse of a second period that is shorter than the first period at earliest from issuing the self-refresh exit command while the semiconductor device is in the second operation mode.

A22. The control method of an information processing system as A19, wherein the controller setting the semiconductor device to a first or second operation mode, the controller, in the first operation mode, issues the external clock signal while the semiconductor device is not in the self-refresh mode, and stops issuing the external clock signal or changes a frequency thereof while the semiconductor device is in the self-refresh mode, and the controller, in the second operation mode, continuously issues the external clock signal without changing the predetermined frequency regardless of whether the semiconductor device is in the self-refresh mode.

A23. The control method of an information processing system as A22, wherein the semiconductor device includes a DLL circuit that generates an internal clock signal based on an output signal of a first input buffer circuit supplied with the external clock signal, and the semiconductor device, in the second operation mode, intermittently activates the first input buffer circuit and the DLL circuit in conjunction with each other while the semiconductor device is in the self-refresh mode.

A24. The control method of an information processing system as A23, wherein the controller further issues a second command that causes the semiconductor device to output the storage data through a data terminal or to control an impedance of the data terminal, the controller, in the first operation mode, issues the second command after elapse of a third period at earliest from issuing the self-refresh exit command, and the controller, in the second operation mode, issues the second command after elapse of a fourth period that is shorter than the third period at earliest from issuing the self-refresh exit command.

A25. The control method of an information processing system as any one of A22 to A24, wherein the controller does not issue an impedance control signal that controls an impedance of a data terminal provided in the semiconductor device to output the storage data during the self-refresh mode in the first operation mode, the controller issues the impedance control signal during the self-refresh mode in the second operation mode, and the semiconductor device further receives the impedance control signal and controls an impedance of the data terminal.

A26. The control method of an information processing system as A25, wherein the controller issues the impedance control signal asynchronously with the external clock signal, and the semiconductor device controls an impedance of the data terminal asynchronously with the external clock signal.

A27. The control method of an information processing system as A26, wherein the controller issues the impedance control signal synchronously with the external clock signal during a period other than the self-refresh mode, and the semiconductor device controls an impedance of the data terminal synchronously with the external clock signal.

A28. The control method of an information processing system as A19, wherein the controller issues an impedance control signal that controls an impedance of a data terminal provided in the semiconductor device to output the storage data during the self-refresh mode, and the semiconductor device receives the impedance control signal and controls an impedance of the data terminal.

A29. The control method of an information processing system as A28, wherein the controller issues the external clock signal to the semiconductor device, the controller issues the impedance control signal with no relation to the external clock signal, and the semiconductor device controls an impedance of the data terminal asynchronously with the external clock signal.

A30. The control method of an information processing system as any one of A19 to A29, wherein the controller issues the external clock signal having the predetermined frequency to first and second semiconductor devices in common.

A31. The control method of an information processing system as any one of A19 to A29, wherein the controller supplies the storage data to a data bus connected in common to first and second semiconductor devices, the controller supplies first and second clock enable signals indicating whether the external clock signal is valid to the first and second semiconductor devices, respectively, the controller supplies first and second impedance control signals that controls an impedance of a data terminal included in the first and second semiconductor devices, respectively, and the self-refresh exit command is expressed by using the first and second clock enable signals.

A32. The control method of an information processing system as any one of A19 to A29, wherein the controller supplies first and second external clock signals having the predetermined frequency to first and second semiconductor devices, respectively, the controller supplies the storage data to a data bus connected in common to the first and second semiconductor devices, the controller supplies first and second clock enable signals each indicating whether an associated one of the first and second external clock signals is valid to the first and second semiconductor devices, respectively, and the controller supplies first and second impedance control signals that controls an impedance of a data terminal included in the first and second semiconductor devices, respectively.

A33. The control method of an information processing system as A32, wherein the first and second semiconductor devices are mounted on different module substrates.

A34. The control method of an information processing system as anyone of A30 to A33, wherein the controller further supplies first and second chip select signals that selects the first and second semiconductor devices, respectively.

A35. A semiconductor device comprising:
a memory cell array that has a plurality of memory cells requiring an refresh operation in order to retain of storage data therein; and
an access control circuit, wherein
the semiconductor device enters a self-refresh mode in response to a self-refresh command, and exits the self-refresh mode in response to a self-refresh exit command,
the access control circuit performs the refresh operation on n memory cells included in the memory cell array in response to an auto-refresh command, and
the access control circuit periodically performs the refresh operation on m memory cells included in the memory cell array asynchronously with an external clock signal during the self-refresh mode, where m is smaller than n.

A36. The semiconductor device as A35, further comprising:
a first input buffer circuit supplied with the external clock signal;
a DLL circuit that generates an internal clock signal that is phase-controlled based on an output signal of the first input buffer circuit; and
an output buffer circuit that outputs the storage data to outside synchronously with the internal clock signal,
wherein the access control circuit does not reset information related to a delay amount of the DLL circuit in response to the self-refresh exit command.

A37. The semiconductor device as A36, wherein
the access control circuit, in a first operation mode, inactivating the DLL circuit during the self-refresh mode, and activating the DLL circuit in response to the self-refresh exit command with resetting the information, and
the access control circuit, in a second operation mode, intermittently activates the DLL circuit and updates the information during the self-refresh mode and does not reset the information in response to the self-refresh exit command.

A38. The semiconductor device as A37, wherein
the access control circuit, in a first operation mode, inactivates the first input buffer circuit during the self-refresh mode, and
the access control circuit, in the second operation mode, intermittently activates the first input buffer circuit and the DLL circuit in conjunction with each other during the self-refresh mode.

A39. The semiconductor device as A37 or A38, wherein the semiconductor device is set to the first or second operation mode according to a mode-register set command supplied from outside.

A40. The semiconductor device as A37 or A38, wherein the semiconductor device is set to the first or second operation mode according to an additional signal that supplied along with the self-refresh command.

A41. The semiconductor device as any one of A36 to A38, further comprising a third input buffer circuit supplied with a clock enable signal indicating whether the external clock signal is valid,
wherein the self-refresh exit command is expressed by using the clock enable signal.

A42. The semiconductor device as A41,
the access control circuit performs an access operation to the memory cell array in response to a first command,
the access control circuit outputs the storage data through a data terminal or to control an impedance of the data terminal in response to a second command, and
the self-refresh exit command is expressed by using a signal supplied to a command terminal to which the first and second command are supplied and the clock enable signal.

A43. The semiconductor device as anyone of A36 to A42, further comprising a second input buffer circuit supplied with an impedance control signal that controls an impedance of the data terminal,
wherein the access control circuit activates the second input buffer circuit during the self-refresh mode.

A44. The semiconductor device as A43, wherein the access control circuit controls the impedance of the data terminal asynchronously with the external clock signal or the internal clock signal when the impedance control signal is issued during the self-refresh mode.

A45. The semiconductor device as A43 or A44, wherein the access control circuit controls the impedance of the data terminal synchronously with the external clock signal or the internal clock signal when the impedance control signal is issued while the semiconductor device is not in the self-refresh mode.

A46. The semiconductor device as any one of A43 to A45, further comprising a latch circuit that latches an output signal of the second input buffer circuit synchronously with an output signal of the first input buffer circuit,
wherein the latch circuit is bypassed during the self-refresh mode.

A47. The semiconductor device as A46, further comprising a switch circuit having a first input node supplied with an output signal of the latch circuit, a second input node supplied with the output signal of the second input buffer circuit, and output node connected to one of the first and second input nodes,
wherein the output node is connected to the second input node during the self-refresh mode.

What is claimed is:
1. An information processing system comprising:
a first device including a memory cell array that holds storage data, the first device having a self-refresh mode in which a refresh operation of the storage data is periodically performed asynchronously with an external clock signal having a predetermined frequency; and
a second device issuing the external clock signal, a self-refresh command that causes the first device to enter the self-refresh mode, a self-refresh exit command that causes the first device to exit the self-refresh mode, and an auto-refresh command, wherein
the first device performs the refresh operation on n memory cells included in the memory cell array in response to the auto-refresh command, and
the first device periodically performs the refresh operation on m memory cells included in the memory cell array during the self-refresh mode, where m is smaller than n.

2. The information processing system as claimed in claim 1, wherein
each of the first and second devices has first and second operation modes,
the second device further issues a first command that causes the first device to perform an access operation to the memory cell array,
the second device, in the first operation mode, issues the first command after elapse of a first period at earliest from issuing the self-refresh exit command, and
the second device, in the second operation mode, issues the first command after elapse of a second period that is shorter than the first period at earliest from issuing the self-refresh exit command.

3. The information processing system as claimed in claim 1, wherein
each of the first and second devices has first and second operation modes,
the second device further issues a second command that causes the first device to output the storage data through a data terminal or to control an impedance of the data terminal,
the second device, in the first operation mode, issues the second command after elapse of a third period at earliest from issuing the self-refresh exit command, and
the second device, in the second operation mode, issues the second command after elapse of a fourth period that is shorter than the third period at earliest from issuing the self-refresh exit command.

4. The information processing system as claimed in claim 3, wherein
the second device, in the first operation mode, stops issuing the external clock signal or changes a frequency thereof while the first device is in the self-refresh mode, and
the second device, in the second operation mode, continuously issues the external clock signal having the predetermined frequency without stopping the external clock signal while the first device is in the self-refresh mode.

5. The information processing system as claimed in claim 4, wherein
the first device further includes a DLL circuit that generates an internal clock signal that is phase-controlled based on the external clock signal,
the first device, in the first operation mode, inactivating the DLL circuit during the self-refresh mode, and activating the DLL circuit in response to the self-refresh exit command with resetting information related to a delay amount of the DLL circuit, and
the first device, in the second operation mode, intermittently activates the DLL circuit during the self-refresh mode and does not reset the information in response to the self-refresh exit command.

6. The information processing system as claimed in claim 5, wherein
the first device further includes a first input buffer circuit to which the external clock signal is supplied,
the first device, in the first operation mode, inactivating the first input buffer circuit and the DLL circuit during the self-refresh mode, and
the first device, in the second operation mode, intermittently activates the first input buffer circuit and the DLL circuit in conjunction with each other during the self-refresh mode.

7. The information processing system as claimed in claim 2, wherein
the second device further issues a mode-register set command, and
the first device is set to the first or second operation mode according to the mode-register set command.

8. The information processing system as claimed in claim 2, wherein
the second device further issues an additional signal that specifies the first or second operation mode along with the self-refresh command, and
the first device is set to the first or second operation mode according to the additional signal.

9. The information processing system as claimed in claim 1, wherein
the second device further issues an impedance control signal to the first device,
the first device further includes a data terminal through which the storage data is output to the second device and a second input buffer circuit to which the impedance control signal that controls an impedance of the data terminal is supplied, and
the first device activates the second input buffer circuit during the self-refresh mode.

10. The information processing system as claimed in claim 9, wherein the first device controls the impedance of the data terminal asynchronously with the external clock signal when the impedance control signal is issued during the self-refresh mode.

11. The information processing system as claimed in claim 9, wherein
the second device issues the impedance control signal synchronously with the external clock signal while the first device is in other than the self-refresh mode, and
the first device controls the impedance of the data terminal synchronously with the external clock signal while the first device is in other than the self-refresh mode.

12. The information processing system as claimed in claim 1, further comprising a third device having substantially the same configuration as the first device, wherein
each of the first and third devices includes:
a clock terminal to which the external clock signal is supplied;
a clock enable terminal to which a clock enable signal indicating whether the external clock signal is valid is supplied;
a data terminal through which the storage data is output;
an ODT terminal to which an impedance control signal that controls an impedance of the data terminal is supplied; and
a chip select terminal to which a chip select signal that selects an associated one of the first and third devices is supplied,
the clock terminals included in the first and third devices are commonly connected with each other,
the data terminals included in the first and third devices are commonly connected with each other,
the clock enable terminals included in the first and third devices are electrically independent of each other,
the ODT terminals included in the first and third devices are electrically independent of each other,
the chip select terminals included in the first and third devices are electrically independent of each other,
the second device supplies the external clock signal commonly to the first and third devices, and
the second device supplies different one of the clock enable signals, different one of the impedance control signals, different one of the chip select signals to the first and third devices, respectively.

13. The information processing system as claimed in claim 1, further comprising a third device having substantially the same configuration as the first device, wherein
each of the first and third devices includes:
a clock terminal to which the external clock signal is supplied;
a clock enable terminal to which a clock enable signal indicating whether the external clock signal is valid is supplied;
a data terminal through which the storage data is output;
an ODT terminal to which an impedance control signal that controls an impedance of the data terminal is supplied; and a chip select terminal to which a chip select signal that selects an associated one of the first and third devices is supplied, the data terminals included in the first and third devices are commonly connected with each other, the clock terminals included in the first and third devices are electrically independent of each other the clock enable terminals included in the first and third devices are electrically independent of each other, the ODT terminals included in the first and third devices are electrically independent of each other, the chip select terminals included in the first and third devices are electrically independent of each other, and the second device supplies different one of the external clock signals, different one of the clock enable signals, different one of the impedance control signals, and different one of the chip select signals to the first and third devices, respectively.

14. The information processing system as claimed in claim 12, wherein the self-refresh exit command is expressed by using the clock enable signal.

15. The information processing system as claimed in claim 12, wherein the first and third devices are mounted on different module substrates.

* * * * *